United States Patent
Teranishi

(10) Patent No.: US 11,859,028 B2
(45) Date of Patent: Jan. 2, 2024

(54) METHOD FOR MANUFACTURING POLYMER

(71) Applicant: DAICEL CORPORATION, Osaka (JP)

(72) Inventor: Tadashi Teranishi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 0 days.

(21) Appl. No.: 17/733,542

(22) Filed: Apr. 29, 2022

(65) Prior Publication Data

US 2022/0259335 A1 Aug. 18, 2022

Related U.S. Application Data

(63) Continuation of application No. 16/539,376, filed on Aug. 13, 2019, now Pat. No. 11,434,308.

(30) Foreign Application Priority Data

Aug. 23, 2018 (JP) .................................. 2018-156485

(51) Int. Cl.
*C08F 2/38* (2006.01)
*B01J 19/00* (2006.01)
(Continued)

(52) U.S. Cl.
CPC ............. *C08F 2/01* (2013.01); *B01J 19/0093* (2013.01); *C08F 2/38* (2013.01); *C08F 20/18* (2013.01);
(Continued)

(58) Field of Classification Search
None
See application file for complete search history.

(56) References Cited

U.S. PATENT DOCUMENTS 6,706,826 B1 3/2004 Fujiwara et al.
2004/0167298 A1 8/2004 Yamagishi et al.
(Continued)

FOREIGN PATENT DOCUMENTS

JP 2004-269855 A 9/2004
JP 2004-355023 A 12/2004
(Continued)

OTHER PUBLICATIONS

"type, n.". OED Online. Mar. 2019. Oxford University Press. Retrieved from www.oed.com Apr. 4, 2019. (Year: 2019).*
(Continued)

*Primary Examiner* — Richard A Huhn
(74) *Attorney, Agent, or Firm* — Birch, Stewart, Kolasch & Birch, LLP

(57) ABSTRACT

Object: To provide a method for manufacturing a polymer, which is a method for forming a polymer having a homogeneous copolymer composition and a narrow molecular weight distribution.
Resolution Means: A method for manufacturing a polymer using a microreactor including a flow path capable of mixing a plurality of liquids to perform radical polymerization of a monomer component containing two or more types of monomers in the presence of a polymerization initiator; wherein the microreactor includes a first inlet port configured to feed the monomer component and an additional inlet port located downstream of the first inlet port; and the method includes feeding the monomer component through the first inlet port and the additional inlet port.

20 Claims, 1 Drawing Sheet

(51) Int. Cl.
  *C08F 2/01* (2006.01)
  *C08F 20/18* (2006.01)
  *C08K 5/38* (2006.01)
  *C08F 220/10* (2006.01)
  *C08F 220/18* (2006.01)

(52) U.S. Cl.
  CPC ....... *C08K 5/38* (2013.01); *B01J 2219/00891* (2013.01); *C08F 220/10* (2013.01); *C08F 220/18* (2013.01)

(56) References Cited

U.S. PATENT DOCUMENTS

| | | |
|---|---|---|
| 2005/0287474 A1 | 12/2005 | Yamagishi et al. |
| 2008/0139836 A1 | 6/2008 | Le et al. |
| 2009/0123868 A1 | 5/2009 | Yamagishi et al. |
| 2013/0217841 A1 | 8/2013 | Chiefari et al. |
| 2016/0002367 A1 | 1/2016 | He et al. |

FOREIGN PATENT DOCUMENTS

| | | |
|---|---|---|
| JP | 2005-307097 A | 11/2005 |
| JP | 2012-107183 A | 6/2012 |
| JP | 2013-144785 A | 7/2013 |
| JP | 2013-185005 A | 9/2013 |
| JP | 2013-543021 A | 11/2013 |
| KR | 2000-0023688 A | 4/2000 |

OTHER PUBLICATIONS

Office Action issued in copending U.S. Appl. No. 16/539,376 dated Sep. 20, 2021.

Office Action issued in Japanese Patent Application No. 2018-156485 dated Apr. 12, 2022.

Japanese Office Action for corresponding Japanese Application No. 2022-094341, dated Apr. 4, 2023.

* cited by examiner

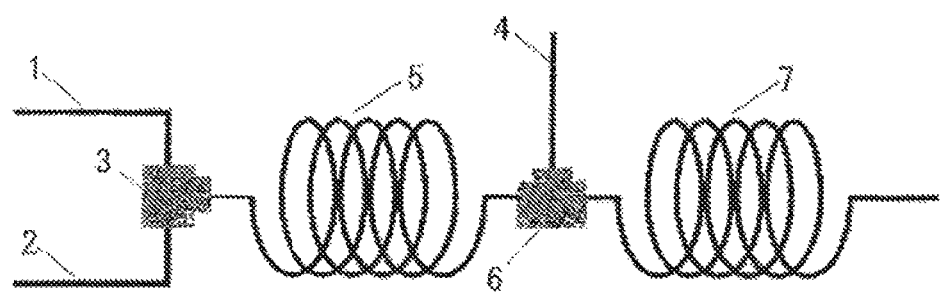

METHOD FOR MANUFACTURING POLYMER

CROSS-REFERENCE TO RELATED APPLICATIONS

This application is a Continuation of copending U.S. application Ser. No. 16/539,376, filed on Aug. 13, 2019, which claims priority under 35 U.S.C. § 119(a) to Application No. 2018-156485, filed in Japan on Aug. 23, 2018, all of which are hereby expressly incorporated by reference into the present application.

TECHNICAL FIELD

The present invention relates to a method for manufacturing a polymer. This application claims priority to Japanese Patent Application No. 2018-156485, filed Aug. 23, 2018 to Japan, the entire contents of which are incorporated herein by reference.

BACKGROUND ART

As the most common method for manufacturing (meth)acrylate polymers, a method called a batchwise polymerization method (batch polymerization method) is known, which includes dissolving a raw material monomer, a polymerization initiator, and, as necessary, a chain transfer agent in a polymerization solvent, and heating the solution to polymerize the monomer. The batchwise polymerization method, however, has a drawback. In this method, controlling the reaction temperature across the entire reaction medium is difficult, and thus subtle variations in the reaction temperature cause differences in the amount of radical generated, leading to a large molecular weight distribution of the resulting polymer (non-uniform molecular weight of the polymer). The difficulty in controlling the reaction temperature also leads to lot-to-lot variations in quality.

Furthermore, in a case where two or more types of monomers having different reactivity are used as raw materials, a polymer formed in the early stage of the polymerization reaction contains high ratio of units derived from a more reactive monomer, and a polymer formed in the late stage of the polymerization reaction contains high ratio of units derived from a less reactive monomer. The batchwise polymerization method, because of its large reaction system, has difficulty in controlling the ratio of monomers present, thus is susceptible to the effects as described above, and has a drawback that the finally obtained polymer has a nonuniform copolymer composition.

Solutions to the above problems include a method called drop-wise polymerization method (semi-batch polymerization method), which includes feeding a raw material monomer, a polymerization initiator, and, as necessary, a chain transfer agent in a mixture or separately into a system maintained at a constant temperature to polymerize the monomer. Known examples of the drop-wise polymerization method include a method including preheating a monomer and adding it drop-wise, and a method of adding a monomer into a polymerization solvent maintained at a constant temperature (Patent Documents 1 and 2).

The drop-wise polymerization method, because of its smaller reaction system than that of the batchwise polymerization method, readily facilitate control of the ratio of even two or more types of raw material monomers present in the reaction system, and thus is effective to provide a homogeneous polymer.

CITATION LIST

Patent Document

Patent Document 1: JP 2004-269855 A
Patent Document 2: JP 2004-355023 A

SUMMARY OF INVENTION

Technical Problem

Photoresist resins are required to have a narrow molecular weight distribution from viewpoint of improved solubility in a developer, in addition to optical properties, chemical properties, and physical properties, such as coating properties and adhesion to a substrate or an underlayer. In particular, in the manufacturing process for a semiconductor material for which fine and precise shapes are required, the polymer with a homogeneous copolymer composition and a narrow molecular weight distribution enables precise control of solubility in a developer, and further enables ultra-fine processing. In addition, as the features of a resist pattern is reduced in size, requirements for the quality of photoresist resins are further increasing, and photoresist resins having a small lot-to-lot variation in molecular weight are required. To meet this need, the drop-wise polymerization method described above is commonly used as a method for manufacturing a photoresist resin. The drop-wise polymerization method, however, has a difficulty in controlling the reaction temperature, and thus is insufficient for manufacturing photoresist resins, which requires higher homogeneity.

In addition, a polymerization method using a microreactor is known as one of flow polymerization methods. Although the method is excellent in controlling the reaction temperature, the polymerization reaction proceeds in the same manner as in a common batch method (e.g., the batchwise polymerization method described above), and thus is insufficient in terms of homogeneity of the copolymer composition in the photoresist resin.

Even though a polymer having a homogeneous copolymer composition and a narrow molecular weight distribution is strongly desired as described above, the manufacturing method therefor has not been established to date.

Accordingly, an object of the present invention is to provide a method for manufacturing a polymer, which is a method for forming a polymer having a homogeneous copolymer composition and a narrow molecular weight distribution.

Solution to Problem

As a result of diligent studies to achieve the above object, the present inventors have found that a radical polymerization of a monomer component containing two or more types of monomers in the presence of a polymerization initiator in particular reaction conditions can provide a polymer having a homogeneous copolymer composition and a narrow molecular weight distribution.

The present invention has been completed based on these findings.

That is, in an embodiment of the present invention, a method for manufacturing a polymer using a microreactor including a flow path capable of mixing a plurality of liquids to perform radical polymerization of a monomer component containing two or more types of monomers in the presence of a polymerization initiator is provided;

wherein the microreactor includes a first inlet port configured to feed the monomer component and an additional inlet port located downstream of the first inlet port; and the method includes feeding the monomer component through the first inlet port and the additional inlet port.

The monomer component to be fed through the first inlet port and the additional inlet port preferably contains two or more types of (meth)acrylic-based monomers.

Preferably, the monomers contained in the monomer component to be fed through the first inlet port and the additional inlet port are the same, and a difference between the contents of each monomer is within ±5%.

In an embodiment of the present invention, the radical polymerization is performed preferably in the presence of the polymerization initiator and a chain transfer agent.

In an embodiment of the present invention, preferably, the chain transfer agent contains no cyano group and contains a thiocarbonylthio group, and the polymerization initiator contains no cyano group.

In an embodiment of the present invention, preferably, the chain transfer agent contains a cyano group and a thiocarbonylthio group.

In an embodiment of the present invention, a molecular weight distribution (Mw/Mn) of the polymer is preferably 1.45 or less.

Advantageous Effects of Invention

According to the present invention, a polymer having a homogeneous copolymer composition and a narrow molecular weight distribution can be manufactured.

BRIEF DESCRIPTION OF DRAWINGS

The FIGURE is a conceptual diagram illustrating a microreactor used in the examples.

DESCRIPTION OF EMBODIMENTS

An embodiment of the present invention relates to a method for manufacturing a polymer using a microreactor including a flow path capable of mixing a plurality of liquids to perform radical polymerization of a monomer component containing two or more types of monomers in the presence of a polymerization initiator; wherein the microreactor includes a first inlet port configured to feed the monomer component and an additional inlet port located downstream of the first inlet port; and the method includes feeding the monomer component through the first inlet port and the additional inlet port. Examples of the additional inlet port include an Nth inlet port (N is an integer of two or more), such as a second inlet port, a third inlet port, and a fourth inlet port. In an embodiment of the present invention, the radical polymerization may be performed in the presence of a polymerization initiator and a chain transfer agent.

In a flow path located between the first inlet port and the second inlet port, a monomer component fed through the first inlet port undergoes radical polymerization (referred to as a first reaction). In a flow path located downstream of the second inlet port (the flow path located between the second inlet port and the third inlet port in the case that the microreactor includes the third inlet port), a reaction product produced by the first reaction and a monomer component fed through the second inlet port undergo radical polymerization (referred to as a second reaction). In addition, in a flow path located downstream of the third inlet port (the flow path located between the third inlet port and the fourth inlet port in the case that the microreactor includes the fourth inlet port), a reaction product obtained by the second reaction and a monomer component fed through the third inlet port undergo radical polymerization (referred to as a third reaction). In this manner, in a flow path located downstream of the Nth inlet port, a reactant produced in a flow path located between an (N−1)th inlet port and the Nth inlet port and a monomer component fed through the Nth inlet port undergo radical polymerization (referred to as an Nth reaction, where N is the same as described above).

The reaction product produced by the first reaction undergoes a polymer chain extension reaction described later, which extends the polymer chain thereof. That is, the reaction product has a role as a nucleus of the polymer. Thus, the first reaction can also be referred to as a "polymer nucleation reaction".

The Nth reaction (the second or later reaction) is mainly a reaction that extends the polymer chain of the reaction product produced by the immediately preceding reaction. Thus, the Nth reaction can also be referred to as a "polymer chain extension reaction". However, the Nth reaction may include a reaction that forms a new reaction product that can become a polymer nucleus of the polymer, as a reaction other than the reaction that extends the polymer chain of the reaction product produced by the immediately preceding reaction. That is, the monomer component fed through the Nth inlet port need not only be used in the reaction that extends the polymer chain described above but may form a new polymer (polymer nucleus) through radical polymerization with an unreacted monomer component.

A polymer is produced by radical polymerization of a monomer component containing two or more types of monomers, but the ratio of the monomer units contained in the polymer varies depending on reaction conditions, such as reactivities and concentrations of the monomers used and time. For example, in a case where the reactivities of the monomers used are greatly different, a polymer formed in the early stage of the polymerization reaction contains high ratio of units derived from a more reactive monomer, and a polymer formed in the late stage of the polymerization reaction contains high ratio of units derived from a less reactive monomer. In this manner, the ratio of the monomer units contained in the polymer differs depending on the reaction conditions, and in turn the ratio of the unreacted monomers also differs.

The above situation may also be possible in the first reaction, i.e., the polymer nucleation reaction. Additionally, the polymer chain extension reaction can be controlled such that the polymer of the same composition is produced continuously, by feeding the monomer component in the polymer chain extension reaction to adjust the difference in concentration of each monomer generated in the first reaction.

A well-known or commonly used radical polymerization initiator can be used as the polymerization initiator, and examples thereof include a polymerization initiator containing a cyano group and a polymerization initiator containing no cyano group. One type of polymerization initiator may be used alone, or two or more types may be used.

Examples of the polymerization initiator containing a cyano group include azo compounds containing a cyano group, such as azobisisobutyronitrile (2,2'-azobis(isobutyronitrile)), 2,2'-azobis(2,4-dimethylvaleronitrile), 2,2'-azobis(2-methylbutyronitrile), and 4,4'-azobis(4-cyanovaleric acid).

A well-known or commonly used radical polymerization initiator can be used as the polymerization initiator containing no cyano group, and examples thereof include azo compounds containing no cyano group, such as dimethyl-2,2'-azobisisobutyrate, 2,2'-azobis(2,4,4-trimethylpentane), 2,2'-azobis(2-methylpropane), and dibutyl-2,2'-azobisisobutyrate. Also included are peroxide compounds containing no cyano group; such as ketone peroxides, such as methyl ethyl ketone peroxide and cyclohexanone peroxide; peroxyketals, such as 1,1-bis(tert-hexylperoxy)-3,3,5-trimethylcyclohexane and 1,1-bis(tert-hexylperoxy)cyclohexane; hydroperoxides or dialkyl peroxides, such as p-menthane hydroperoxide and 2,5-dimethyl-2,5-bis(tert-butylperoxy)hexane; diacyl peroxides, such as isobutyryl peroxide and 3,5,5-trimethylhexanoyl peroxide; peroxy esters, such as 1,1,3,3-tetramethylbutylperoxy neodecanate and tert-hexylperoxy neodecanate; and peroxydicarbonates, such as di-n-propyl peroxydicarbonate and diisopropyl peroxydicarbonate. Further included are redox compounds containing no cyano group, such as hydrogen peroxide and ammonium persulfate.

A chain transfer agent well known or commonly used in radical polymerization can be used as the chain transfer agent, and examples thereof include chain transfer agents containing a thiocarbonylthio group (chain transfer agents containing a cyano group and a thiocarbonylthio group, and chain transfer agents containing no cyano group and containing a thiocarbonylthio group). One type of chain transfer agent may be used alone, or two or more types may be used.

Examples of chain transfer agents containing a cyano group and a thiocarbonylthio group include dithiobenzoate-based chain transfer agents containing a cyano group, such as 2-cyano-2-propyl 4-cyanobenzodithioate, 4-cyano-4-(phenylcarbonothioylthio)pentanoic acid, 2-cyano-2-propylbenzodithioate, 4-cyano-4-(phenylcarbonothioylthio)pentanoic acid N-succinimidyl ester; trithiocarbonate-based chain transfer agents containing a cyano group, such as 4-cyano-4-[(dodecylsulfanylthiocarbonyl)sulfanyl]pentanoic acid, 2-cyano-2-propyl dodecyl trithiocarbonate, 4-cyano-4-[(dodecylsulfanylthiocarbonyl)sulfanyl]pentanol, poly(ethylene glycol)methyl ether 4-cyano-4-[(dodecylsulfanylthiocarbonyl)sulfanyl]pentanoate, poly(ethylene glycol)methyl ether(4-cyano-4-pentanoate dodecyl trithiocarbonate), and cyanomethyl dodecyl trithiocarbonate; dithiocarbamate-based chain transfer agents containing a cyano group, such as cyanomethyl methyl(phenyl)carbamodithioate, cyanomethyl diphenylcarbamodithioate, 1-succinimidyl-4-cyano-4-[N-methyl-N-(4-pyridyl)carbamothioylthio]pentanoate, 2-cyanopropan-2-yl N-methyl-N-(pyridin-4-yl)carbamodithioate, and cyanomethyl methyl(4-pyridyl)carbamodithioate; and xanthate-based chain transfer agents containing a cyano group. Among them, from viewpoint of molecular weight distribution of the resulting polymer, 4-cyano-4-(phenylcarbonothioylthio)pentanoic acid, 2-cyano-2-propylbenzodithioate, 4-cyano-4-[(dodecylsulfanylthiocarbonyl)sulfanyl]pentanoic acid, and 2-cyano-2-propyl dodecyl trithiocarbonate are preferred.

Examples of chain transfer agents containing no cyano group and containing a thiocarbonylthio group include dithiobenzoate-based chain transfer agents containing no cyano group, such as 2-phenyl-2-propyl benzodithioate, 1-(methoxycarbonyl)ethyl benzodithioate, benzyl benzodithioate, ethyl-2-methyl-2-(phenylthiocarbonylthio)propionate, methyl-2-phenyl-2-(phenylcarbonothioylthio)acetate, ethyl-2-(phenylcarbonothioylthio)propionate, and bis(thiobenzoyl)disulfide; trithiocarbonate-based chain transfer agents containing no cyano group, such as 2-(dodecylthiocarbonylthioylthio)propionic acid, 2-(dodecylthiocarbonylthioylthio)-2-methyl propionic acid, methyl-2-(dodecylthiocarbonylthioylthio)-2-methyl propionate, 2-(dodecylthiocarbonylthioylthio)-2-methyl propionic acid N-hydroxy succinimide ester, poly(ethylene glycol)methyl ether(2-methyl-2-propionic acid dodecyl trithiocarbonate), poly(ethylene glycol)bis[2-(dodecylthiocarbonylthioylthio)-2-methyl propionate], 2-(dodecylthiocarbonylthioylthio)-2-methyl propionic acid 3-azido-1-propanol ester, 2-(dodecylthiocarbonylthioylthio)-2-methyl propionic acid pentafluorophenyl ester, poly(ethylene glycol)methyl ether 2-(dodecylthiocarbonylthioylthio)-2-methylpropionate, poly(ethylene glycol)bis[2-(dodecylthiocarbonylthioylthio)-2-methylpropionate], and bis(dodecylsulfanylthiocarbonyl)disulphide; dithiocarbamate-based chain transfer agents containing no cyano group, such as benzyl 1H-pyrrole-1-carbodithioate, methyl 2-propionate methyl(4-pyridinyl)carbamodithioate, and N,N'-dimethyl N,N'-di(4-pyridinyl)thiuram disulfide; and xanthate-based chain transfer agents containing no cyano group. Among them, from the viewpoint of molecular weight distribution of the resulting polymer, ethyl-2-methyl-2-(phenylthiocarbonylthio)propionate is preferred.

In an embodiment of the present invention, when a chain transfer agent containing a cyano group and a thiocarbonylthio group is used, a polymer having a cyano group at the terminal (polymer terminal) is obtained. A cyano group exhibits low solubility in solvents (e.g., photoresist solvents), and thus polymers having a cyano group at the terminal tend to have low solubility in solvents. In the polymer, however, the chain transfer agent has a high ability to adjust the degree of polymerization of the polymer, and thus a polymer having a homogeneous copolymer composition and a narrow molecular weight distribution is readily formed. As a result, the polymer readily exhibits high solubility in solvents (e.g., photoresist solvents).

On the other hand, when a chain transfer agent containing no cyano group and containing a thiocarbonylthio group is used as the chain transfer agent, and a polymerization initiator containing no cyano group is used as the polymerization initiator, a polymer having no cyano group at the terminal is obtained. Thus, the polymer readily exhibits high solubility in solvents.

An embodiment of the present invention may be performed in the absence of a solvent or in the presence of a solvent (polymerization solvent). Examples of the solvent include glycol-based solvents (glycol-based compounds), ester-based solvents, ketone-based solvents, ether-based solvents, amide-based solvents, sulfoxide-based solvents, hydrocarbon-based solvents, and mixed solvents thereof. One type of polymerization solvent may be used alone, or two or more types may be used.

Examples of the glycol-based solvent include propylene glycol monomethyl ether acetate, ethylene glycol monomethyl ether acetate, ethylene glycol monoethyl ether acetate, and ethylene glycol monobutyl ether acetate. Examples of the ester-based solvent include lactate ester-based solvents, such as ethyl lactate; propionate ester-based solvents, such as methyl 3-methoxypropionate; acetate ester-based solvents, such as methyl acetate, ethyl acetate, propyl acetate, and butyl acetate. Examples of the ketone-based solvent include acetone, methyl ethyl ketone, methyl isobutyl ketone, methyl amyl ketone, cyclopentanone, and cyclohexanone. Examples of the ether-based solvent include linear ethers, such as diethyl ether, diisopropyl ether, dibutyl ether, and dimethoxyethane; and cyclic ethers, such as tetrahydrofuran and dioxane. Examples of the amide-based solvent include N,N-dimethylformamide. Examples of the sulfoxide-based solvent include dimethyl sulfoxide. Examples of the hydrocarbon-based solvent include aliphatic hydrocarbons, such as pentane, hexane, heptane, and octane; alicyclic hydrocarbons, such as cyclohexane and methylcyclohexane; and aromatic hydrocarbons, such as benzene, toluene, and xylene. Among them, glycol-based solvents, such as propylene glycol monomethyl ether and propylene glycol monomethyl ether acetate; ester-based solvents, such as ethyl lactate; ketone-based solvents, such as acetone, methyl ethyl ketone, methyl isobutyl ketone, methyl amyl ketone, cyclopentanone, and cyclohexanone; and mixed solvents thereof are preferably used.

Polymer Nucleation Reaction

The polymer nucleation reaction, i.e. the first reaction, of an embodiment of the present invention is a reaction in which a monomer component fed through the first inlet port into the microreactor undergoes radical polymerization. The monomer component fed from the first inlet port undergoes a radical polymerization initiated by the polymerization initiator present in the microreactor system to form a reaction product (radical polymer). The method for feeding the monomer component into the microreactor is not particularly limited. Examples thereof include a method for feeding the monomer component into the microreactor via an inlet path (hereinafter, it may be referred to as a "monomer inlet path").

The method for feeding the polymerization initiator into the microreactor is not particularly limited. Examples thereof include method for feeding the polymerization initiator into the microreactor via an inlet path (hereinafter, it may be referred to as a "polymerization initiator inlet path"). The feeding of the polymerization initiator into the microreactor is not particularly limited. Examples thereof include [1] feeding the polymerization initiator before the feeding of the monomer component into the microreactor, [2] feeding of the polymerization initiator simultaneously with the feeding of the monomer component into the microreactor, and [3] feeding of the polymerization initiator after the feeding of the monomer component into the microreactor, and in particular, [2] is preferred in that it enables efficient mixing of the monomer component and the polymerization initiator, and facilitates control of the reaction time and reaction temperature.

In the case where the radical polymerization is performed in the presence of a polymerization initiator and a chain transfer agent, the method for feeding the chain transfer agent is the same as that described for the method for feeding the polymerization initiator, and examples thereof include method for feeding the chain transfer agent into the microreactor via an inlet path (hereinafter, it may be referred to as a "chain transfer agent inlet path"). In addition, the inlet path may be the same as the polymerization initiator inlet path. That is, the method may be a method for preparing a solution containing a polymerization initiator and a chain transfer agent in advance, and feeding the solution into the microreactor via an inlet path (hereinafter, it may be referred to as an "inlet path for a polymerization initiator and others"). The use of a chain transfer agent enables control of the polymerization reaction, thereby providing a polymer having a more homogeneous copolymer composition and a narrower molecular weight distribution.

The reaction temperature of the present reaction (polymer nucleation reaction), i.e., the temperature of the flow path located between the first inlet port and the second inlet port, is not particularly limited, and can be appropriately selected according to the purpose. For example, it is preferably from 0 to 200° C., more preferably from 20 to 180° C., still more preferably from 40 to 160° C., particularly preferably from 60 to 140° C., and most preferably from 80 to 120° C.

The molar concentration of the monomer component (total molar concentration of the monomers) in the present reaction is not particularly limited, and can be appropriately selected according to the purpose, but, for example, it is preferably from 0.01 to 5.0 mol/L, more preferably from 0.05 to 3.0 mol/L, and particularly preferably from 0.1 to 2.0 mol/L. At a concentration within the above range, the reaction readily achieves a good yield of the polymer produced per unit time. On the other hand, at a concentration higher than 5.0 mol/L, the reaction has problems that the viscosity of the reaction solution increases or the monomer component does not dissolve. In addition, at a concentration less than 0.01 mol/L, the reaction has a problem that the reaction rate decreases and the amount of the polymer produced decreases (the reaction does not proceed sufficiently). The concentration above refers to the molar concentration of the monomer component in the flow path immediately after fed into the microreactor.

The flow rate of the reaction solution in the present reaction is not particularly limited, and can be appropriately selected according to the purpose, but, for example, it is preferably from 0.001 to 10 mL/min, more preferably from 0.005 to 3 mL/min, and particularly preferably from 0.01 to 1 mL/min. At a flow rate within the above range, the rapid mixing of the monomer component and the polymerization initiator are readily achieved, and further, the pressure loss tends to be prevented. The flow rate above refers to the flow rate of the reaction solution in the flow path immediately after fed into the microreactor.

The residence time in the present reaction is not particularly limited, and can be appropriately selected according to the purpose, but, for example, it is preferably from 1 to 180 min, more preferably from 5 to 120 min, and particularly preferably from 8 to 90 min. At a residence time within the above range, the resulting polymer tends to have a narrower molecular weight distribution.

The concentration of the polymerization initiator in the present reaction is not particularly limited, and can be appropriately selected according to the composition and concentration of the monomer component, but, for example, it is preferably from 0.0001 to 3.0 mol/L, more preferably from 0.0005 to 1.5 mol/L, still more preferably from 0.001 to 0.5 mol/L, and particularly preferably from 0.005 to 0.2 mol/L. At a concentration within the above range, blockage of the flow path of the microreactor can be prevented, and the resulting polymer tends to have a narrower molecular weight distribution. The concentration above refers to the concentration of the polymerization initiator in the flow path immediately after fed into the microreactor.

The concentration of the chain transfer agent in the present reaction is not particularly limited, and can be appropriately selected according to the composition and concentration of the monomer component, but, for example it is preferably from 0.0001 to 3.0 mol/L, more preferably from 0.0005 to 1.5 mol/L, still more preferably from 0.001 to 0.5 mol/L, and particularly preferably from 0.005 to 0.2 mol/L. At a concentration within the above range, blockage of the flow path of the microreactor can be prevented, and the resulting polymer tends to have a narrower molecular weight distribution. The concentration above refers to the concentration of the chain transfer agent in the flow path immediately after fed into the microreactor.

The total concentration of the polymerization initiator and the chain transfer agent in the present reaction is not particularly limited, and can be appropriately selected according to the composition and concentration of the monomer component, but, for example, it is preferably from 0.0001 to 3.0 mol/L, more preferably from 0.0005 to 1.5 mol/L, still more preferably from 0.001 to 0.5 mol/L, and particularly preferably from 0.005 to 0.2 mol/L. At a concentration within the above range, blockage of the flow path of the microreactor can be prevented, and the resulting polymer tends to have a narrower molecular weight distribution. The concentration above refers to the concentration in the flow path immediately after the agents are fed into the microreactor.

The concentration ratio of the polymerization initiator and the chain transfer agent to the monomers (polymerization initiator and chain transfer agent/monomers) in an embodiment of the present invention is not particularly limited, but, for example, it is preferably from 0.001 to 100.0 mol %, more preferably from 0.01 to 50.0 mol %, still more preferably from 0.05 to 30.0 mol %, and particularly preferably from 0.1 to 20.0 mol %. At a concentration ratio within the above range, blockage of the flow path of the microreactor can be prevented, and the resulting polymer tends to have a narrower molecular weight distribution. The concentration above refers to the concentrations of the polymerization initiator and the chain transfer agent in the flow path immediately after fed into the microreactor.

Polymer Chain Extension Reaction

The polymer chain extension reaction, i.e., the Nth reaction (N is an integer of 2 or greater), is a reaction in which, in a flow path located downstream of the Nth inlet port, a reaction product produced in a flow path located between an (N−1)th inlet port and the Nth inlet port and a monomer component fed through the Nth inlet port undergo radical polymerization. The method for feeding the monomer component into the microreactor is not particularly limited. Examples thereof include a method for feeding the monomer component into the microreactor via an inlet path. For example, the second reaction is a reaction in which, in a flow path located downstream of the second inlet port (a flow path located between the second inlet port and the third inlet port in the case that the microreactor includes the third inlet port), a reaction product produced in a flow path located between the first inlet port and the second inlet port and a monomer component fed through the second inlet port undergo radical polymerization. In addition, examples of the method for feeding the monomer component into the microreactor include a method for feeding the monomer component into the microreactor via an inlet path.

The monomer component to be fed through the first inlet port and the additional inlet port preferably contains the same monomers; more preferably, the same monomers are contained therein and a difference between the contents of each monomer is within ±5%; still more preferably, the same monomers are contained therein and the difference between the contents of each monomer is within ±1%; and particularly preferably, the same monomers are contained therein in the same amount (substantially the same). The "difference between the contents of each monomer" means a difference between a content (wt. %) of a particular monomer contained in a monomer component to be fed through the additional inlet port and a content (wt. %) of the particular monomer contained in a monomer component to be fed through the first inlet port (wt. %). For example, in a case where the content of a monomer A contained in a monomer component to be fed through the first inlet port is 50 wt. %, and the content of the monomer A contained in a monomer component to be fed to the additional inlet port is 51 wt. %, the difference (%) is (51/50−1)×100=2%. In addition, "a difference between the contents of each monomer is within ±5%" means that a difference between the contents of each monomer is within ±5% in all the monomers contained in the monomer component. For example, it means that when the monomer component contains a monomer A and a monomer B, the difference between the contents of the monomer A is within ±5% and the difference between the contents of the monomer B is within ±5%.

The reaction temperature of the present reaction (polymer chain extension reaction), i.e., the temperature of the flow path located downstream of the Nth inlet port (e.g., between the second inlet port and the third inlet port), is not particularly limited, and can be appropriately selected according to the purpose. For example, it is preferably from 0 to 200° C., more preferably from 20 to 180° C., still more preferably from 40 to 160° C., particularly preferably from 60 to 140° C., and most preferably from 80 to 120° C. The reaction temperature of the present reaction may be the same as the reaction temperature of the polymer nucleation reaction.

The molar concentration of the monomer component (total molar concentration of the monomer) in the present reaction is not particularly limited, and can be appropriately selected according to the purpose, but, for example, it is preferably from 0.01 to 5.0 mol/L, more preferably from 0.05 to 3.0 mol/L, and particularly preferably from 0.1 to 2.0 mol/L. At a concentration within the range described above, the reaction readily achieves a good yield of the polymer produced per unit time. On the other hand, at a concentration higher than 5.0 mol/L, the reaction has problems that the viscosity of the reaction solution increases and the monomer component does not dissolve. Alternatively, at a concentration less than 0.01 mol/L, the reaction has a problem that the reaction rate decreases and the amount of the polymer produced decreases (the reaction does not proceed sufficiently). The molar concentration above refers to the molar concentration of the monomer component in the flow path immediately after fed into the microreactor.

The flow rate of the reaction solution in the present reaction is not particularly limited, and can be appropriately selected according to the purpose. For example, it is preferably from 0.001 to 10 mL/min, more preferably from 0.005 to 3 mL/min, and particularly preferably from 0.01 to 1 mL/min. At a flow rate within the range described above, the rapid mixing of the monomer component and the polymerization initiator can be achieved, and further, the pressure loss tends to be prevented. The flow rate described above refers to the flow rate of the reaction solution in the flow path immediately after fed into the microreactor.

The residence time in the present reaction is not particularly limited, and can be appropriately selected according to the purpose, but, for example, it is preferably from 1 to 180 min, more preferably from 5 to 120 min, and particularly preferably from 8 to 90 min. At a residence time within the above range, the resulting polymer tends to have a narrower molecular weight distribution.

The concentration of the polymerization initiator in the present reaction is not particularly limited, and can be appropriately selected according to the composition and concentration of the monomer component. For example, it is preferably from 0.0001 to 3.0 mol/L, more preferably from 0.0005 to 1.5 mol/L, still more preferably from 0.001 to 0.5 mol/L, and particularly preferably from 0.005 to 0.2 mol/L. At a concentration within the range described above, blockage of the flow path of the microreactor can be prevented, and the resulting polymer tends to have a narrower molecular weight distribution. The concentration above refers to the concentration of the polymerization initiator in the flow path immediately after fed into the microreactor.

The concentration of the chain transfer agent in the present reaction is not particularly limited, and can be appropriately selected according to the composition and concentration of the monomer component. For example, it is preferably from 0.0001 to 3.0 mol/L, more preferably from 0.0005 to 1.5 mol/L, still more preferably from 0.001 to 0.5 mol/L, and particularly preferably from 0.005 to 0.2 mol/L. At a concentration within the range described above, blockage of the flow path of the microreactor can be prevented, and the resulting polymer tends to have a narrower molecular weight distribution. The concentration above refers to the concentration of the chain transfer agent in the flow path immediately after fed into the microreactor.

The total concentration of the polymerization initiator and the chain transfer agent in the present reaction is not particularly limited, and can be appropriately selected according to the composition and concentration of the monomer component. For example, it is preferably from 0.0001 to 1.0 mol/L, more preferably from 0.0003 to 0.5 mol/L, still more preferably from 0.0005 to 0.3 mol/L, and particularly preferably from 0.001 to 0.1 mol/L. At a concentration within the range described above, blockage of the flow path of the microreactor can be prevented, and the resulting polymer tends to have a narrower molecular weight distribution. The concentration above refers to the concentrations of the polymerization initiator and the chain transfer agent in the flow path immediately after fed into the microreactor.

The concentration ratio of the polymerization initiator and the chain transfer agent to the monomers (polymerization initiator and chain transfer agent/monomers) in the present reaction is not particularly limited. For example, it is preferably from 0.001 to 100.0 mol %, more preferably from 0.01 to 50.0 mol %, still more preferably from 0.05 to 30.0 mol %, and particularly preferably from 0.1 to 20.0 mol %. At a concentration ratio within the range described above, blockage of the flow path of the microreactor can be prevented, and the resulting polymer tends to have a narrower molecular weight distribution. The concentration ratio above refers to the concentration ratio of the polymerization initiator and the chain transfer agent to the monomers in the flow path immediately after fed into the microreactor.

The method for collecting the polymer is not particularly limited. Examples thereof include a method using precipitation (including re-precipitation). For example, the target polymer can be obtained by adding the reaction solution to a solvent (precipitation solvent) to precipitate the polymer; or by dissolving the polymer again in an appropriate solvent, and adding the solution to a solvent (a re-precipitation solvent) to re-precipitate the polymer; or alternatively by adding a solvent (a re-precipitation solvent or a polymerization solvent) to the reaction solution to dilute the reaction solution. The precipitation or re-precipitation solvent may be either an organic solvent or water and may be a mixed solvent.

The precipitation or re-precipitation solvent is not particularly limited, and may be the same solvent as the polymerization solvent or a different solvent. Examples of the precipitation or re-precipitation solvent include organic solvents exemplified as polymerization solvents (glycol-based solvents, ester-based solvents, ketone-based solvents, ether-based solvents, amide-based solvents, sulfoxide-based solvents, and hydrocarbon-based solvents); halogenated hydrocarbons (halogenated aliphatic hydrocarbons, such as methylene chloride, chloroform, and carbon tetrachloride; halogenated aromatic hydrocarbons, such as chlorobenzene and dichlorobenzene); nitro compounds (such as nitromethane and nitroethane); nitriles (such as acetonitrile and benzonitrile); carbonates (such as dimethyl carbonate, diethyl carbonate, ethylene carbonate, and propylene carbonate); carboxylic acids (such as acetic acid); and mixed solvents containing these solvents.

Among them, the precipitation or re-precipitation solvent is preferably a solvent containing at least a hydrocarbon (in particular, an aliphatic hydrocarbon, such as hexane and heptane) or an alcohol (in particular, such as methanol, ethanol, propanol, isopropyl alcohol, and butanol). In such a solvent containing at least a hydrocarbon, as a ratio of a hydrocarbon (e.g., an aliphatic hydrocarbon, such as hexane and heptane) and an additional solvent (e.g., esters, such as ethyl acetate), the hydrocarbon/the additional solvent (volume ratio at 25° C.), is from 10/90 to 99/1, preferably the hydrocarbon/the additional solvent (volume ratio at 25° C.) is from 30/70 to 98/2, more preferably the hydrocarbon/the additional solvent (volume ratio at 25° C.) is 50/50 to 97/3.

Also preferred as the precipitation or re-precipitation solvent are a mixed solvent of an alcohol (in particular, methanol) and water, and a mixed solvent of a glycol-based solvent (in particular, polyethylene glycol) and water. In such a solvent, as a ratio (volume ratio at 25° C.) of the organic solvent (an alcohol or a glycol-based solvent) to water, for example, the organic solvent/water (volume ratio at 25° C.) is from 10/90 to 99/1, preferably the organic solvent/water (volume ratio at 25° C.) is from 30/70 to 98/2, and more preferably the organic solvent/water (volume ratio at 25° C.) is from 50/50 to 97/3.

The polymer obtained by precipitation (including re-precipitation) is subjected to rinsing or a process of washing by adding the polymer to a solvent under stirring to disperse the polymer in the solvent (sometimes referred to as "repulping"), as necessary. The polymer may be subjected to rinsing after repulping. Materials adhered to the polymer, such as a residual monomer and a low molecular weight oligomer, can be efficiently removed by repulping or rinsing the polymer produced by polymerization with a solvent.

In an embodiment of the present invention, a repulping or rinsing solvent is preferably a solvent containing, among others, at least a hydrocarbon (in particular, an aliphatic hydrocarbon, such as hexane and heptane), an alcohol (in particular, such as methanol, ethanol, propanol, isopropyl alcohol, and butanol), or esters (in particular, such as ethyl acetate).

After the precipitation (including re-precipitation), repulping, or rinsing, for example, the solvent may be removed as necessary by decantation, filtration, or the like, and drying treatment may be performed.

Microreactor

As the microreactor, a microreactor including a flow path capable of mixing a plurality of liquids can be used. The microreactor includes a plurality of inlet ports at different locations in the flow path along the flow, and includes at least an inlet port (a first inlet port) configured to feed a monomer component into the microreactor, and an additional inlet port (an Nth inlet port) configured to feed a monomer component into the microreactor, the additional inlet port being located downstream of the first inlet port. The microreactor may include one or two or more of the additional inlet ports. In addition, as necessary, the microreactor may include an inlet path, that communicates with the flow path, configured to feed a liquid into the flow path through the first inlet port or the additional inlet port. Examples of the inlet path include the polymerization initiator inlet path, the chain transfer agent inlet path, the inlet path for polymerization initiator and others, and the monomer inlet path, as described above. When the microreactor includes an inlet path, the inlet port (e.g., the first inlet port and the second inlet port) method a confluence section of the inlet path and the flow path. In addition, as necessary, the microreactor may further include a configuration other than the flow path, the inlet port, and the inlet path.

The cross-sectional shape of the flow path is not particularly limited, and can be appropriately selected according to the purpose. Examples thereof include a circle, a rectangle, a semicircle, and a triangle.

The microreactor may include an inlet port configured to feed the polymerization initiator into the microreactor at a location upstream of the first inlet port, at the same location as the first inlet port, or at a location downstream of the first inlet port (between the first inlet port and the second inlet port). From the viewpoint of keeping the concentration of the polymerization initiator in the flow path constant, the microreactor includes an inlet port configured to feed the polymerization initiator into the microreactor preferably at the same location as the first inlet port. Similarly, when using the chain transfer agent, the microreactor may include an inlet port configured to feed the chain transfer agent into the microreactor at a location upstream of the first inlet port, at the same location as the first inlet port, or at a location downstream of the first inlet port, and the microreactor includes an inlet port configured to feed the chain transfer agent into the microreactor preferably at the same location as the first inlet port.

The microreactor may or may not include an inlet port configured to feed the polymerization initiator into the microreactor at the same location as the Nth inlet port (e.g., the second inlet port) or at a location downstream of the Nth inlet port. When feeding the polymerization initiator into the microreactor, from the viewpoint of keeping the concentration of the polymerization initiator in the flow path constant, the microreactor includes an inlet port configured to feed the polymerization initiator into the microreactor preferably at the same location as the Nth inlet port. Similarly, when using the chain transfer agent, the microreactor includes an inlet port configured to feed the chain transfer agent into the microreactor at the same location as the Nth inlet port or at a location downstream of the Nth inlet port, and the microreactor includes an inlet port configured to feed the chain transfer agent into the microreactor preferably at the same location as the Nth inlet port.

The microreactor is not particularly limited as long as it includes a flow path capable of mixing a plurality of liquids, and can be appropriately selected according to the purpose, and examples thereof include micromixers (such as substrate type micromixers and pipe joint type micromixers) and branched tubes.

A substrate type micromixer includes a substrate having a flow path formed in the interior or on the surface of the substrate and sometimes may be referred to as a microchannel. The substrate type micromixer is not particularly limited as long as it does not impair the effect of an embodiment of the present invention, and can be appropriately selected according to the purpose. Examples thereof include a mixer having a fine flow path for mixing described in Pamphlet of WO 96/30113; and a mixer described in a literature "Microreactors" Chapter 3, by W. Ehrfeld, V. Hessel, and H. Lowe, published by Wiley-VCH.

In addition to the flow path, an inlet path, in communication with the flow path, configured to feed a plurality of liquids into the flow path is preferably formed in the substrate type micromixer. That is, the substrate type micromixer is preferably configured to branch the flow path at the upstream side according to the number of the inlet path. The number of the inlet path is not particularly limited, and can be appropriately selected according to the purpose. Preferably, a plurality of liquids desired to be mixed are fed from separate inlet paths and combined and mixed in a flow path. In addition, the substrate type micromixer may be configured such that one liquid is charged in the flow path in advance and an additional liquid is fed thereto through the inlet path.

The pipe joint type micromixer includes a flow path formed in the interior thereof, and, as necessary, a connecting part for connecting the flow path formed in the interior of the pipe joint type micromixer and a tube. The connection method of the connecting part is not particularly limited, and can be appropriately selected, according to the purpose, from well-known tube connection methods. Examples thereof include screw-in type, union type, butt welding type, slip-on welding type, socket welding type, flange type, flareless type, flare type, and mechanical type.

In addition to the flow path, an inlet path, in communication with the flow path, configured to feed a plurality of liquids into the flow path is preferably formed in the interior of the pipe joint type micromixer. That is, the pipe joint type micromixer is preferably configured to branch the flow path at the upstream side according to the number of the inlet path. In a case where the microreactor includes two inlet paths, for example, a T-shaped or Y-shaped pipe joint configuration can be used in the pipe joint type micromixer, and in a case where the microreactor includes three inlet paths, for example, a cross-shaped pipe joint configuration can be used. Alternatively, the pipe joint type micromixer may be configured such that one liquid is charged in the flow path in advance and an additional liquid is fed thereto through the inlet path.

The material of the micromixer (e.g., the flow path) is not particularly limited, and can be appropriately selected according to requirements, such as heat resistance, pressure resistance, solvent resistance, and ease of processing. Examples thereof include stainless steel, titanium, copper, nickel, aluminum, and silicon; and fluororesins, such as Teflon (trade name) and perfluoroalkoxy resin (PFA); trifluoroacetamide (TFAA), and polytetrafluoroethylene (PTFE).

The micromixer precisely controls the flow of the reaction solution by its microstructure, and thus it is preferably fabricated by a microfabrication technique. The microfabrication technique is not particularly limited, and can be selected appropriately according to the purpose. Examples thereof include (a) LIGA technology, which combines X-ray lithography and electroplating, (b) high aspect ratio photolithography method using EPON SUB, (c) mechanical micromachining processing (such as micro-drilling process employing a high-speed drilling machine equipped with a micrometer-order drill bit), (d) high aspect ratio processing of silicon by Deep RIE, (e) Hot Emboss processing, (f) optical fabrication method, (g) laser processing method, and (h) ion beam method.

A commercially available product can be used as the micromixer, and examples thereof include a microreactor equipped with an interdigital channel structure; a single mixer and a caterpillar mixer available from Institut für Mikrotechnik Mainz (IMM); a microglass reactor available from Microglass Inc.; Cytos available from CPC Systems, Inc.; a YM-1 type mixer and a YM-2 type mixer available from Yamatake Corporation; a mixing tee and a tee (T-connector) available from Shimadzu GLC Ltd.; an IMT chip reactor available from Institute of Microchemical Technology Co., Ltd., Micro High Mixer developed by Toray Engineering Co., Ltd.; and a union tee available from Swagelok Company.

The microreactor may be configured such that the micromixer is used alone, or a tube reactor is further connected downstream of the micromixer to extend the flow path. The length of the flow path can be adjusted by connecting the tube reactor downstream of the micromixer. The residence time (reaction time) of the mixed liquid is proportional to the length of the flow path.

The tube reactor is configured to precisely control the time (control the residence time) required for a subsequent reaction of the solution that has been rapidly mixed by the micromixer to be performed. The tube reactor is not particularly limited, and, for example, the configuration such as the tube inner diameter, outer diameter, length, and material thereof, can be appropriately selected according to a desired reaction. A commercially available product can be used as the tube reactor. The material of the tube reactor is not particularly limited, and materials exemplified as the material of the micromixer can be suitably used.

The flow path has a function of mixing a plurality of liquids by diffusion and a function of removing the heat of reaction. The mixing method of the liquid in the flow path is not particularly limited, and can be appropriately selected according to the purpose. Examples thereof include laminar flow mixing and turbulent flow mixing. Among them, laminar flow mixing (static mixing) can preferably facilitate the efficient reaction control and heat removal. Note that the flow path of the microreactor is so minute that the plurality of liquids fed from the inlet paths naturally and readily form a laminar flow-dominant flow, and diffuse in a direction orthogonal to the flow to be mixed. The laminar flow mixing may be configured such that the laminar flow cross-section of the flowing liquid is divided by further providing a branching point and a confluence point in the flow path, and may be configured to increase the mixing speed. On the other hand, in a case where turbulent flow mixing (dynamic mixing) is performed in the flow path of the microreactor, the flow can be changed from laminar flow to turbulent flow by adjusting the flow rate and the shape of the flow path (the three-dimensional shape of the liquid contact portion; shapes, such as the bending, of the flow path; roughness of the wall surface; and the like). The turbulent flow mixing has an advantage of good mixing efficiency and high mixing speed compared to the laminar flow mixing.

Here, a flow path having a smaller inner diameter can shorten the diffusion distance of the molecule, and in turn reduce the time required for mixing and improve the mixing efficiency. Furthermore, the ratio of the surface area to the volume becomes large, and, for example, this facilitates temperature control, such as removal of the heat of reaction. On the other hand, a flow path with too small inner diameter increases pressure drop in the liquid flow, and requires a special high pressure-resistant pump to be used for pumping liquid, and this may result in a high manufacturing cost. This also increases the tendency for blockage of the flow path due to the reaction product. Furthermore, the pumping flow rate is limited, and thus the structure of the micromixer may be limited.

The inner diameter of the flow path is not particularly limited as long as it does not impair the effect of an embodiment of the present invention, and can be appropriately selected according to the purpose. For example, it is preferably from 50 µm to 15 mm, more preferably from 100 µm to 10 mm, still more preferably from 200 µm to 5 mm, and particularly preferably from 500 µm to 3 mm. A flow path with an inner diameter less than 50 µm may increase the pressure drop. A flow path with an inner diameter greater than 15 mm has a smaller surface area per unit volume, and as a result, may have difficulties in rapid mixing and removal of the heat of reaction. On the other hand, a flow path with an inner diameter within the above range achieves rapid mixing of a monomer component and a polymerization initiator (and a chain transfer agent) fed thereto, and can efficiently remove the heat of reaction, and thus tends to facilitate control of the heat of reaction.

The cross-sectional area of the flow path is not particularly limited, and can be appropriately selected according to the purpose. For example, it is preferably from 5000 µm$^2$ to 800 mm$^2$, and more preferably from 0.75 mm$^2$ to 30 mm$^2$. A flow path with a cross-sectional area within the range described above achieves rapid mixing of a monomer component and a polymerization initiator (and a chain transfer agent) fed thereto, and can efficiently remove the heat of reaction, and thus tends to facilitate control of the heat of reaction.

The length (total length) of the flow path in the microreactor is not particularly limited, and can be appropriately adjusted according to the optimal reaction time. For example, it is preferably from 0.5 to 500 m, and more preferably from 1 to 400 m. The length of the flow path in the polymer nucleation reaction (the first reaction) is, for example, preferably from 0.1 to 125 m, more preferably from 0.3 to 100 m, and still more preferably from 0.5 to 80 m. The length of the flow path in the polymer chain extension reaction (e.g., the second reaction) is, for example, preferably from 0.1 to 125 m, more preferably from 0.3 to 100 m, and still more preferably from 0.5 to 80 m.

The inlet path is in communication with the flow path and has a function of feeding a plurality of liquids into the flow path. Another end in the inlet path opposite from the side in communication with the flow path is usually connected to a container containing a liquid desired to be mixed.

The inner diameter of the inlet path is not particularly limited as long as it does not impair the effect of an embodiment of the present invention, and can be appropriately selected according to the purpose. For example, it is preferably from 50 µm to 15 mm, more preferably from 100 µm to 10 mm, still more preferably from 200 µm to 5 mm, and particularly preferably from 500 µm to 3 mm. When the microreactor has a plurality of inlet paths, the inner diameter of each inlet path may be the same or different from each other.

The configuration other than the flow path and the inlet path is not particularly limited, and can be appropriately selected according to the purpose. Examples thereof include a pump used for pumping liquid, a temperature control means, a reaction promoting means, a sensor, and a tank for storing a manufactured polymer.

The pump is not particularly limited, and can be appropriately selected from those that can be used industrially, and it is preferably a pump that does not cause pulsation during pumping liquid, and examples thereof include a plunger pump, a gear pump, a rotary pump, and a diaphragm pump.

The temperature control method is not particularly limited, and can be appropriately selected according to the reaction temperature. Examples thereof include a constant temperature bath, a circulator, and a heat exchanger. For example, in a case where the reaction temperature is 80° C., an oil bath is preferably used. In addition, in a case where cooling is performed to collect the obtained polymer, a constant temperature layer filled with water or ice water is preferably used.

The reaction promoting method can be appropriately selected according to a liquid to be mixed and a desired reaction, and examples thereof include a method for imparting vibration energy, a heating method, a light irradiation method, and a voltage application method. Examples of the microreactor including a voltage application method include a microflow electrochemical reactor disclosed in JP 2006-104538 A. The sensor is not particularly limited, and examples thereof include a temperature sensor, a flow rate sensor, and a pressure sensor for measuring pressure in the flow path.

Monomer Component

The monomer component of an embodiment of the present invention contains two or more types of monomers. Examples of the monomer constituting the monomer component include (meth)acrylic-based monomers, aromatic vinyl monomers, carboxylic acid vinyl esters, conjugated diene-based monomers, olefin-based monomers, vinyl halides, and vinylidene halides, and from the viewpoint of reactivity thereof, the monomer is preferably a (meth) acrylic-based monomer. That is, the monomer component to be fed through the first inlet port and the additional inlet port preferably contains two or more types of (meth)acrylic-based monomers.

Examples of the (meth)acrylic-based monomer include (meth)acrylic acid; alkyl (meth)acrylates, such as methyl (meth)acrylate, ethyl (meth)acrylate, propyl (meth)acrylate, butyl (meth)acrylate, t-butyl (meth)acrylate, pentyl (meth) acrylate, and hexyl (meth)acrylate; cycloalkyl (meth)acrylates, such as 1-methylcyclopentyl (meth)acrylate, 1-ethylcyclopentyl (meth)acrylate, 1-isopropylcyclopentyl (meth) acrylate, 1-propylcyclopentyl (meth)acrylate, 1-methylcyclohexyl (meth)acrylate, 1-ethylcyclohexyl (meth)acrylate, 1-isopropylcyclohexyl (meth)acrylate, and 1-propylcyclohexyl (meth)acrylate; (meth)acrylates having a cyclic ester group, such as γ-butyrolactone (meth)acrylate; (meth)acrylates having a cyclic ether group, such as 3,4-epoxycyclohexyl (meth)acrylate, glycidyl (meth)acrylate, β-methylglycidyl acrylate, and oxetanyl (meth)acrylate; (meth)acrylic esters having a hydroxyl group, such as 2-hydroxyethyl (meth)acrylate, hydroxypropyl (meth)acrylate, hydroxybutyl (meth)acrylate, and caprolactone-modified 2-hydroxyethyl (meth)acrylate; and ethylene glycol (meth) acrylates, such as methoxy diethylene glycol (meth)acrylate, ethoxy diethylene glycol (meth)acrylate, isooctyloxy diethylene glycol (meth)acrylate, phenoxy triethylene glycol (meth)acrylate, methoxy triethylene glycol (meth)acrylate, and methoxy polyethylene glycol (meth)acrylate. In addition to the above, monomers explained for the photoresist resin described later are exemplified.

Examples of the aromatic vinyl monomer include styrene; alkyl styrenes (such as vinyltoluenes, such as o-, m-, and p-methylstyrenes; vinylxylenes, such as 2,4-dimethylstyrene; p-ethylstyrene; p-isopropylstyrene; p-butylstyrene; and p-t-butylstyrene); α-alkylstyrene (such as α-methylstyrene and α-methyl-p-methylstyrene); alkoxystyrene (such as o-, m-, and p-methoxystyrene, and p-t-butoxystyrene); halostyrene (such as o-, m-, and p-chlorostyrene, and p-bromostyrene); and styrenesulfonic acid and alkali metal salts thereof.

Examples of the carboxylic acid vinyl ester include $C_{1-10}$ carboxylic acid vinyl esters, such as vinyl formate, vinyl acetate, vinyl propionate, and vinyl pivalate.

Examples of the conjugated diene-based monomer include $C_{4-16}$ dienes, such as butadiene, isoprene, chloroprene, neoprene, 1,3-pentadiene, 2,3-dimethyl-1,3-butadiene, piperine, 3-butyl-1,3-octadiene, and phenyl-1,3-butadiene.

Examples of the olefin monomer include $C_{2-10}$ alkenes, such as ethylene, propylene, and butene (such as isobutene).

Examples of the vinyl halide include vinyl fluoride, vinyl chloride, and vinyl bromide. Examples of the vinylidene halide include vinylidene fluoride, vinylidene chloride, and vinylidene bromide.

An embodiment of the present invention can provide a polymer having a homogeneous copolymer composition and a narrow molecular weight distribution, and thus is particularly suited for manufacturing a photoresist resin. Thus, the monomer component preferably contains a monomer having a group whose portion is eliminated by the action of an acid to form a polar group (it may be referred to as an "acid-degradable group"). As a result, the polymer (photoresist resin) exhibits increased polarity due to the action of the acid, and in turn has increased solubility in an alkaline developer.

Examples of the polar group include acidic groups, such as phenolic hydroxyl groups, carboxy groups, fluorinated alcohol groups (preferably a hexafluoroisopropanol group), sulfonic acid groups, sulfonamido groups, sulfonylimide groups, (alkylsulfonyl)(alkylcarbonyl)methylene groups, (alkylsulfonyl)(alkylcarbonyl)imide groups, bis(alkylcarbonyl)methylene groups, bis(alkylcarbonyl)imide groups, bis (alkylsulfonyl)methylene groups, bis(alkylsulfonyl)imide groups, tris(alkylcarbonyl)methylene groups, and tris(alkylsulfonyl)methylene groups; and alcoholic hydroxyl groups. Among them, carboxy groups, fluorinated alcohol group (preferably a hexafluoroisopropanol group), and sulfonate groups are preferred.

The acid-degradable group is preferably a group in which a hydrogen atom of the polar group has been substituted with a group to be eliminated by an acid. Examples of the acid-degradable group include $-C(R^{I})(R^{II})(R^{III})$ and $-C(R^{IV})(R^{V})(OR^{VI})$. In the formula, $R^{I}$ to $R^{III}$, and $R^{VI}$ each independently represent an alkyl group, a cycloalkyl group, an aryl group, an aralkyl group, or an alkenyl group. $R^{IV}$ and $R^{V}$ each independently represent a hydrogen atom, an alkyl group, a cycloalkyl group, an aryl group, an aralkyl group, or an alkenyl group. At least two groups of $R^{I}$ to $R^{III}$ may be bonded to each other to form a ring. In addition, $R^{IV}$ and $R^{V}$ may be bonded to each other to form a ring.

The number of carbon atoms in the acid-degradable group is not particularly limited, but is preferably 4 or greater, and more preferably 5 or greater. The upper limit of the number of carbon atoms is not particularly limited, but is preferably 20.

The alkyl group of the $R^{I}$ to $R^{VI}$ is preferably an alkyl group having from 1 to 8 carbons, and examples thereof include a methyl group, an ethyl group, a propyl group, a n-butyl group, a s-butyl group, a t-butyl group, a hexyl group, and an octyl group.

The cycloalkyl group of the $R^{I}$ to $R^{VI}$ may be a monocyclic hydrocarbon group or a polycyclic (bridged cyclic) hydrocarbon group. The monocyclic hydrocarbon group is preferably a cycloalkyl group having from 3 to 8 carbon atoms, and examples thereof include a cyclopropyl group, a cyclobutyl group, a cyclopentyl group, a cyclohexyl group, and a cyclooctyl group. The polycyclic hydrocarbon group is preferably a cycloalkyl group having from 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. At least one carbon atom in the cycloalkyl group may be substituted with a hetero atom, such as an oxygen atom.

The aryl group of the $R^I$ to $R^{VI}$ is preferably an aryl group having from 6 to 14 carbons, and examples thereof include a phenyl group, a naphthyl group, and an anthryl group.

The aralkyl group of the $R^I$ to $R^{VI}$ is preferably an aralkyl group having from 7 to 12 carbons, and examples thereof include a benzyl group, a phenethyl group, and a naphthylmethyl group.

The alkenyl group of the $R^I$ to $R^{VI}$ is preferably an alkenyl group having from 2 to 8 carbons, and examples thereof include a vinyl group, an allyl group, a butenyl group, and a cyclohexenyl group.

A ring formed by the at least two groups of the $R^I$ to $R^{III}$ bonded to each other, and a ring formed by $R^{IV}$ and $R^V$ bonded to each other are preferably a cycloalkane ring. Examples of the cycloalkane ring include monocyclic cycloalkane rings, such as a cyclopropane ring, a cyclobutane ring, a cyclopentane ring, and a cyclohexane ring; and polycyclic cycloalkane rings, such as a norbornane ring, a tricyclodecane ring, a tetracyclododecane ring, and an adamantane ring.

The alkyl group, the cycloalkyl group, the aryl group, the aralkyl group, the alkenyl group, and the cycloalkane ring in $R^I$ to $R^{VI}$ may each have a substituent.

The acid-degradable group is preferably, among others, a t-butyl group, t-amyl group, and groups represented by Formulas (I) to (IV) below.

[Chemical formula 1]

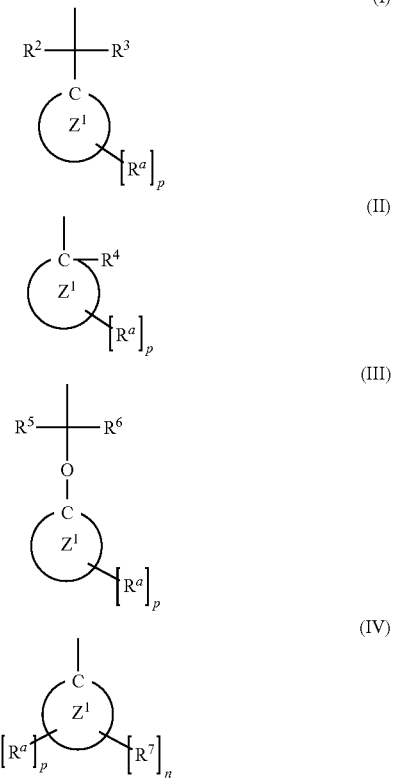

$R^2$ to $R^7$, $R^a$, n, p, and a ring $Z^1$ in Formulas (I) to (IV) above are respectively the same as $R^2$ to $R^7$, $R^a$, n, p, and a ring $Z^1$ in Formulas (a1) to (a4) described later.

The acid-degradable group may be provided via a spacer. The spacer is the same as a linking group exemplified and described as A in Formula (1) described later.

Examples of the monomer having an acid-degradable group include monomers represented by Formula (1) below.

[Chemical formula 2]

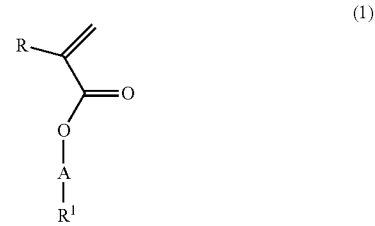

In Formula (1) above, $R^1$ represents the acid-degradable group. In Formula (1) above, R represents a hydrogen atom, a halogen atom, or an alkyl group that has from 1 to 6 carbons and may have a halogen atom. Examples of the halogen atom include a chlorine atom, a bromine atom, and an iodine atom. Examples of the alkyl group having from 1 to 6 carbons include a methyl group, an ethyl group, a propyl group, an isopropyl group, a n-butyl group, an iso-butyl group, a s-butyl group, a t-butyl group, a pentyl group, an isoamyl group, a s-amyl group, a t-amyl group, a hexyl group. Examples of the alkyl group having from 1 to 6 carbons and having a halogen atom include a group (halo ($C_{1-6}$) alkyl group) in which one or two or more of hydrogen atoms constituting the alkyl group have been substituted with halogen atoms, such as trifluoromethyl and 2,2,2-trifluoroethyl groups.

In Formula (1) above, A represents a single bond or a linking group. Examples of the linking group include a carbonyl group (—C(=O)—), an ether bond (—O—), an ester bond (—C(=O)—O—), an amide bond (—C(=O)—NH—), a carbonate bond (—O—C(=O)—O—), a group in which a plurality of these groups are linked, and a group in which an alkylene group and these groups are bonded. Examples of the alkylene group include linear or branched alkylene groups, such as a methylene group, a methylmethylene group, a dimethylmethylene group, an ethylene group, a propylene group, and a trimethylene group; and divalent alicyclic hydrocarbon groups (in particular, divalent cycloalkylene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

The monomer represented by Formula (1) above is preferably, among others, at least one type of monomer selected from the group consisting of monomers represented by Formulas (a1) to (a4) below. "At least one type of monomer selected from the group consisting of monomers represented by Formulas (a1) to (a4)" may be referred to as a "monomer a".

[Chemical formula 3]

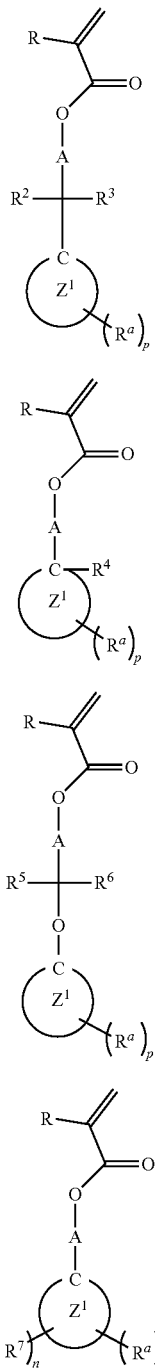

In the monomers represented by Formulas (a1) to (a4) above, R represents a hydrogen atom, a halogen atom, or an alkyl group that has from 1 to 6 carbons and may have a halogen atom, similarly to R in Formula (1), and A represents a single bond or a linking group. A in Formulas (a1) to (a4) above is preferably, among others, a single bond, and a group in which an alkylene group and a carbonyloxy group are bonded (alkylene-carbonyloxy group). $R^2$ to $R^4$ are the same or different and represent an alkyl group that has from 1 to 6 carbons and may have a substituent. $R^2$ and $R^3$ may be bonded to each other to form a ring. $R^5$ and $R^6$ are the same or different and represent an alkyl group that has from 1 to 6 carbons and may have a hydrogen atom or a substituent. $R^7$ represents a —$COOR^c$ group, and the $R^c$ represents a tertiary hydrocarbon group, a tetrahydrofuranyl group, a tetrahydropyranyl group, or an oxepanyl group that has a substituent. n represents an integer of 1 to 3, wherein, when n is 2 or 3, two or three $R^7$s may each be the same or different. $R^a$ represents a substituent bonded to the ring $Z^1$, the substituents being the same or different and are an oxo group, an alkyl group, a hydroxy group that may be protected with a protecting group, a hydroxyalkyl group that may be protected with a protecting group, or a carboxy group that may be protected with a protecting group; p represents an integer of 0 to 3; and the ring $Z^1$ represents an alicyclic hydrocarbon ring having from 3 to 20 carbons; wherein, when p is 2 or 3, two or three $R^a$s may each be the same or different.

Examples of the alkyl group in the $R^a$ include alkyl groups having from 1 to 6 carbons, such as a methyl group, an ethyl group, a propyl group, an isopropyl group, a n-butyl group, a s-butyl group, a t-butyl group, a pentyl group, an isoamyl group, a s-amyl group, a t-amyl group, and n-hexyl group.

Examples of the hydroxyalkyl group in the $R^a$ include hydroxy $C_{1-6}$ alkyl groups, such as a hydroxymethyl group, a 2-hydroxyethyl group, a 1-hydroxyethyl group, a 3-hydroxypropyl group, a 2-hydroxypropyl group, a 4-hydroxybutyl group, and a 6-hydroxyhexyl group.

Examples of the protecting group that the hydroxy group and the hydroxyalkyl group in the $R^a$ may have include $C_{1-4}$ alkyl groups, such as a methyl group, an ethyl group, and a t-butyl group; a group that forms an acetal bond together with an oxygen atom constituting the hydroxy group (e.g., $C_{1-4}$ alkyl-O—$C_{1-4}$ alkyl groups, such as a methoxymethyl group); a group that forms an ester bond together with the oxygen atom constituting the hydroxy group (e.g., such as an acetyl group and a benzoyl group).

Examples of the protecting group of the carboxy group in the $R^a$ include $C_{1-6}$ alkyl groups, such as a methyl group, an ethyl group, a propyl group, an isopropyl group, a n-butyl group, a s-butyl group, a t-butyl group, a pentyl group, an isoamyl group, a s-amyl group, a t-amyl group, and a hexyl group; a 2-tetrahydrofuranyl group; a 2-tetrahydropyranyl group; and a 2-oxepanyl group.

Examples of the alkyl group having from 1 to 6 carbons in the $R^2$ to $R^6$ include linear or branched alkyl groups, such as a methyl group, an ethyl group, a propyl group, an isopropyl group, a n-butyl group, an iso-butyl group, a s-butyl group, a t-butyl group, a pentyl group, an isoamyl group, a s-amyl group, a t-amyl group, and a hexyl group. In an embodiment of the present invention, among them, $C_{1-4}$ alkyl groups are preferable, $C_{1-3}$ alkyl groups are more preferable, and $C_{1-2}$ alkyl groups are still more preferable.

Examples of the substituent that the alkyl group having 1 to 6 carbons in the $R^2$ to $R^6$ may have include a halogen atom, a hydroxy group, a substituted hydroxy group (e.g., such as a $C_{1-4}$ alkoxy group, such as a methoxy group, an ethoxy group, and a propoxy group), and a cyano group. Examples of the alkyl group having from 1 to 6 carbons and having a substituent include a halo ($C_{1-6}$) alkyl group in which one or two or more of hydrogen atoms constituting the alkyl group have been substituted with halogen atoms, such as a trifluoromethyl group and a 2,2,2-trifluoroethyl group; a hydroxymethyl group, a 2-hydroxyethyl group, a methoxymethyl group, a 2-methoxyethyl group, an ethoxymethyl group, a 2-ethoxy ethyl group, a cyanomethyl group, and a 2-cyanoethyl group.

In the case where $R^2$ and $R^3$ are bonded to each other to form a ring, examples of the ring include alicyclic hydrocarbon rings that have 3 to 12 carbons and may have a substituent.

Examples of the tertiary hydrocarbon group in the $R^c$ include a t-butyl group and a t-amyl group.

Examples of the substituent that the tertiary hydrocarbon group in the $R^c$ may have include a halogen atom, a hydroxy group, a substituted hydroxy group (e.g., such as a $C_{1-4}$ alkoxy group, such as a methoxy group, an ethoxy group, and a propoxy group), and a cyano group.

Examples of the alicyclic hydrocarbon ring having from 3 to 20 carbons in the ring $Z^1$ include monocyclic alicyclic hydrocarbon rings; such as approximately 3- to 20-membered (preferably 3- to 15-membered and particularly preferably 5- to 12-membered) cycloalkane rings, such as a cyclopropane ring, a cyclobutane ring, a cyclopentane ring, a cyclohexane ring, and a cyclooctane ring; and approximately 3- to 20-membered (preferably 3- to 15-membered and particularly preferably 5- to 10-membered) cycloalkene rings, such as a cyclopropene ring, a cyclobutene ring, a cyclopentene ring, and a cyclohexene ring; an adamantane ring; rings containing a norbornane ring or a norbornene ring, such as a norbornane ring, a norbornene ring, a bornane ring, an isobornane ring, a tricyclo[$5.2.1.0^{2,6}$] decane ring, and a tetracyclo [$4.4.0.1^{2,5}.1^{7,10}$] dodecane ring; a ring in which a polycyclic aromatic fused ring has been hydrogenated (preferably a fully hydrogenated ring), such as a perhydroindene ring, a decalin ring (perhydronaphthalene ring), a perhydrofluorene ring (a tricyclo [$7.4.0.0^{3,8}$] tridecane ring), and a perhydroanthracene ring; approximately from bicyclic to hexacyclic bridged hydrocarbon rings, such as bridged hydrocarbon rings of bicyclic system, tricyclic system, tetracyclic system, etc. (e.g., bridged cyclic hydrocarbon rings having approximately from 6 to 20 carbons), such as a tricyclo[$4.2.2.1^{2,5}$]undecane ring.

The monomer component preferably contains a monomer having an alicyclic skeleton at least having —C(=O)—O—, —S(=O)$_2$—O—, or —C(=O)—O—C(=O)—. The use of monomers having an alicyclic skeleton can impart better substrate adhesion and etching resistance to polymers (photoresist resins). The monomer having an alicyclic skeleton at least having —C(=O)—O—, —S(=O)$_2$—O—, or —C(=O)—O—C(=O)— may be referred to as a "monomer b".

The monomer b is preferably, among others, at least one type of monomer selected from the group consisting of monomers represented by Formulas (b1) to (b5) below. In Formulas (b1) to (b5) below, R represents a hydrogen atom, a halogen atom, or an alkyl group that has from 1 to 6 carbons and may have a halogen atom, and A represents a single bond or a linking group. X represents a non-bond, a methylene group, an ethylene group, an oxygen atom, or a sulfur atom. Y represents a methylene group or a carbonyl group. Z represents a divalent organic group (e.g., an alkylene group exemplified and described as an alkylene group that may be contained in A in the monomers represented by Formulas (a1) to (a4) (in particular, a linear alkylene group having from 1 to 3 carbons)). $V^1$ to $V^3$ are the same or different and represent —CH$_2$—, —C(=O)—, or —C(=O)—O— with the proviso that at least one of $V^1$ to $V^3$ is —C(=O)—O—. $R^8$ to $R^{14}$ are the same or different and represent a hydrogen atom, a fluorine atom, an alkyl group that may have a fluorine atom, a hydroxy group that may be protected with a protecting group, a hydroxyalkyl group that may be protected with a protecting group, a carboxy group that may be protected with a protecting group, or a cyano group.

[Chemical formula 4]

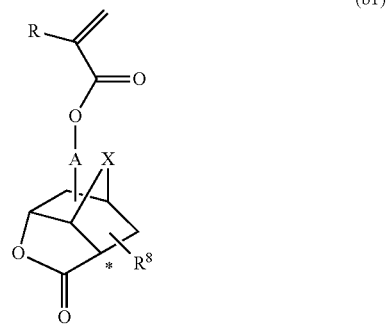

(b1)

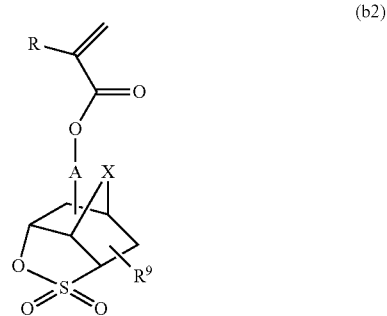

(b2)

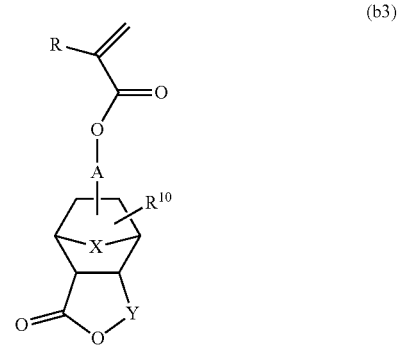

(b3)

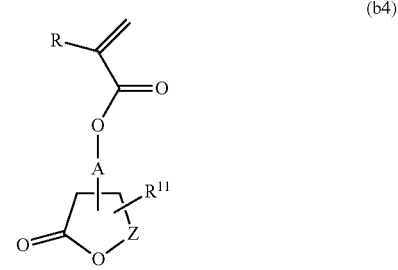

(b4)

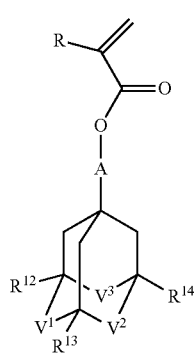

(b5)

Examples of R and A in the monomers represented by Formulas (b1) to (b5) include the same examples as R and A in the monomers represented by Formulas (a1) to (a4). Examples of the alkyl group, the hydroxy group that may be protected with a protecting group, the hydroxyalkyl group that may be protected with a protecting group, and a carboxy group that may be protected with a protecting group in $R^8$ to $R^{14}$ in the monomers represented by Formulas (b1) to (b5) include the same examples as those for $R^a$ in the monomers represented by Formulas (a1) to (a4).

Examples of the alkyl group in the $R^8$ to $R^{14}$ include a group [fluoro ($C_{1-6}$) alkyl group] in which one or two or more of hydrogen atoms constituting the alkyl group have been substituted with fluorine atoms, such as trifluoromethyl and 2,2,2-trifluoroethyl groups.

The monomers represented by Formulas (b1) to (b4) above may have one or two or more $R^8$ to $R^{11}$ therein, respectively, and the monomers have preferably one to three $R^8$ to $R^{11}$ therein, respectively. In addition, in a case where the monomers represented by Formulas (b1) to (b4) above have two or more $R^8$ to $R^{11}$ therein, two or more $R^8$ to RH may be the same or different, respectively.

Among monomers b, a monomer represented by Formula (b1) where $R^8$ is an electron-withdrawing group, such as a cyano group, a group having an amide group, a group having an imide group, or a fluoro ($C_{1-6}$) alkyl group; a monomer represented by Formula (b2); a monomer represented by Formula (b3) where Y is a carbonyl group; a monomer represented by Formula (b4); and a monomer represented by Formula (b5) are preferred in that they can impart excellent substrate adhesion and etching resistance to polymers (photoresist resins), has excellent solubility in an alkaline developer, and can form a fine pattern with high precision.

In Formula (b1) above, in a case where $R^8$ is an electron-withdrawing group, such as a cyano group, a group having an amide group, a group having an imide group, or a fluoro ($C_{1-6}$) alkyl group, the $R^8$ is particularly preferably at least bonded to a carbon atom marked by * in Formula (b1).

The monomer component may further contain a monomer c. The monomer c is a monomer represented by Formula (c1) below. In a case where the monomer component contains the monomer c, the monomer component can impart higher transparency and etching resistance to polymers (photoresist resins). In the formula, R represents a hydrogen atom, a halogen atom, or an alkyl group that has from 1 to 6 carbons and may have a halogen atom. A represents a single bond or a linking group. $R^b$ represents a hydroxy group that may be protected with a protecting group, a hydroxyalkyl group that may be protected with a protecting group, a carboxy group that may be protected with a protecting group, or a cyano group, and among them, a hydroxy group and a cyano group are preferred. q represents an integer of 1 to 5. The ring $Z^2$ represents an alicyclic hydrocarbon ring having from 6 to 20 carbons; wherein, when q is an integer of 2 to 5, two to five $R^b$s may each be the same or different.

[Chemical formula 5]

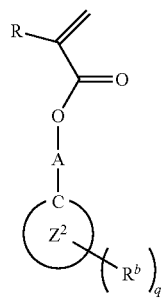

(c1)

Examples of R and A in the monomers represented by Formula (c1) include the same examples as R and A in the monomers represented by Formulas (a1) to (a4). In addition, examples of the hydroxy group that may be protected with a protecting group, the hydroxyalkyl group that may be protected with a protecting group, and a carboxy group that may be protected with a protecting group in $R^b$ in the monomers represented by Formula (c1) include the same examples as those for $R^a$ in the monomers represented by Formulas (a1) to (a4).

The ring $Z^2$ in the monomers represented by Formula (c1) represents an alicyclic hydrocarbon ring having from 6 to 20 carbons, and examples thereof include monocyclic alicyclic hydrocarbon rings; such as approximately 6- to 20-membered (preferably 6- to 15-membered and particularly preferably 6- to 12-membered) cycloalkane rings, such as a cyclohexane ring and a cyclooctane ring; and approximately 6- to 20-membered (preferably 6- to 15-membered and particularly preferably 6- to 10-membered) cycloalkene rings, such as a cyclohexene ring; an adamantane ring; rings containing a norbornane ring or a norbornene ring, such as a norbornane ring, a norbornene ring, a bornane ring, an isobornane ring, a tricyclo[$5.2.1.0^{2,6}$] decane ring, and a tetracyclo [$4.4.0.1^{2,5}.1^{7,10}$] dodecane ring; a ring in which a polycyclic aromatic fused ring has been hydrogenated (preferably a fully hydrogenated ring), such as a perhydroindene ring, a decalin ring (perhydronaphthalene ring), a perhydrofluorene ring (a tricyclo [$7.4.0.0^{3,8}$] tridecane ring), and a perhydroanthracene ring; approximately from bicyclic to hexacyclic bridged hydrocarbon rings, such as bridged hydrocarbon rings of bicyclic system, tricyclic system, tetracyclic system, etc. (e.g., bridged cyclic hydrocarbon rings having approximately from 6 to 20 carbons), such as a tricyclo [$4.2.2.1^{2,5}$] undecane ring. Among them, the ring $Z^2$ is preferably a ring containing a norbornane ring or a norbornene ring; and an adamantane ring.

Polymer

The polymer obtained in an embodiment of the present invention has a homogeneous copolymer composition and a narrow molecular weight distribution, and thus it has, for example, a characteristic that its solubility in solvents is extremely high. Therefore, the polymer can be suitably used as a photoresist resin or the like.

The weight average molecular weight (Mw) of the polymer is not particularly limited. It is, for example, preferably from 1000 to 50000, more preferably from 1500 to 40000, still more preferably from 2000 to 20000, particularly preferably from 2500 to 10000, and most preferably from 3000 to 6000. The molecular weight distribution (Mw/Mn) of the polymer is not particularly limited. It is, for example, preferably 2.00 or less, more preferably 1.45 or less, and still more preferably 1.20 or less. When the polymer obtained in an embodiment of the present invention is used as a photoresist resin, the polymer, which has a molecular weight distribution (Mw/Mn) of 1.45 or less, preferably exhibits excellent solubility in an alkaline developer and can form a fine pattern with a high precision. The weight average molecular weight (Mw) and the number average molecular weight (Mn) in the present specification can be measured, for example, by GPC using polystyrene as a reference material.

Photoresist Resin Composition

The polymer obtained in an embodiment of the present invention can be used as a photoresist resin as described above. That is, a composition containing the polymer obtained in an embodiment of the present invention and a radiation-sensitive acid generator can be used as a photoresist resin composition.

A commonly used or well-known compound that efficiently generates an acid by exposure to a radiation, such as a visible light, an ultraviolet light, a far-ultraviolet light, an electron beam, or an X-ray, can be used as the radiation-sensitive acid generator. Such a compound is composed of a nucleus and an acid to be generated. Examples of the nucleus include onium salt compounds, such as iodonium salts, sulfonium salts (including tetrahydrothiophenium salts), phosphonium salts, diazonium salts, and pyridinium salts; sulfonimide compounds; sulfone compounds; sulfonate compounds; disulfonyldiazomethane compounds; disulfonylmethane compounds; oxime sulfonate compounds; and hydrazine sulfonate compounds. In addition, examples of the acid to be generated by the exposure include alkyl or fluorinated alkyl sulfonic acids, alkyl or fluorinated alkyl carboxylic acids, and alkyl or fluorinated alkyl sulfonyl imide acids. One type of them may be used alone, or two or more types may be used.

The radiation-sensitive acid generator can be used in an amount appropriately selected according to the strength of the acid to be produced by the irradiation with the radiation, the ratio of each repeating unit in the photoresist resin, and the like. For example, the amount can be selected from a range from 0.1 to 30 parts by weight, preferably from 1 to 25 parts by weight, and still more preferably from 2 to 20 parts by weight per 100 parts by weight of the photoresist resin.

The photoresist resin composition can be prepared, for example, by mixing the photoresist resin and the radiation-sensitive acid generator in a solvent for a resist. Solvents such as a glycol-based solvent, an ester-based solvent, a ketone-based solvent, and a mixed solvent thereof exemplified as the polymerization solvent can be used as the solvent for a resist.

The concentration of the photoresist resin in the photoresist resin composition is not particularly limited, and is, for example, from 3 to 40 wt. %. The photoresist resin composition may contain an alkali-soluble component, such as an alkali-soluble resin (e.g., a novolac resin, a phenol resin, an imide resin, and a carboxy group-containing resin); a coloring agent (e.g., a dye); or the like.

Pattern Forming Method

The photoresist resin composition is coated onto a base material or a substrate and dried, and then the coating film (resist film) is exposed via a predetermined mask (or further baked after the exposure) to form a latent image pattern, then subjected to an alkaline dissolution, and thus a fine pattern can be formed with high precision.

Examples of the base material or the substrate include silicon wafers, metals, plastics, glasses, and ceramics. The coating of the photoresist resin composition can be performed using a commonly used coating method, such as a spin coater, a dip coater, and a roller coater. The thickness of the coating film is, for example, from 0.05 to 20 μm and preferably from 0.1 to 2 μm.

A radiation, such as a visible light, an ultraviolet light, a far-ultraviolet light, an electron beam, and an X-ray can be used for the exposure.

An acid is generated from the radiation-sensitive acid generator by the exposure, and a protecting group (acid-degradable group), such as a carboxy group, of a polymerized unit (repeating unit having an acid-degradable group) that becomes alkali soluble by the action of the acid of the photoresist resin composition is quickly eliminated by this acid to form a carboxy group and the like that contribute to solubilization. As a result, the predetermined pattern can be formed with high accuracy by development with an alkaline developer.

EXAMPLES

Hereinafter, the present invention will be described in more detail based on examples, but the present invention is not limited by these examples. The weight average molecular weight (Mw) and the number average molecular weight (Mn) of the resin were determined by gel permeation chromatography (GPC) measurement using a tetrahydrofuran solvent. Polystyrene was used for a reference sample and a refractometer (refractive index detector; RI detector) was used as a detector. In addition, the GPC measurement was performed using three columns connected in series, available from Showa Denko K.K. (trade name "KF-806L"), under conditions of a column temperature of 40° C., a RI temperature of 40° C., and a tetrahydrofuran flow rate of 0.8 mL/min. The molecular weight distribution (Mw/Mn) was calculated from the measurements.

The microreactor used in the present examples is the microreactor illustrated in the FIGURE including a micromixer composed of a T-shaped pipe joint and a tube reactor connected downstream of the micromixer. Specifically, the microreactor includes an inlet path for polymerization initiator and others 1, which is an inlet path for a polymerization initiator, or a polymerization initiator and a chain transfer agent; a first monomer inlet path 2; a micromixer 3, which is a confluence section (mixing section) of these inlet paths; a tube reactor 5, which is a flow path connected downstream of the micromixer 3; a second monomer inlet path 4; a micromixer 6, which is a confluence section (mixing section) of the tube reactor 5 and the second monomer inlet path 4, and a tube reactor 7, which is a flow path connected downstream of the micromixer 6. The microreactor used in the present examples further includes pumps for pumping liquid, which are provided upstream of the inlet path for polymerization initiator and others 1, upstream of the first monomer inlet path 2, and upstream of the second monomer inlet path 4. These pumps are omitted in the FIGURE. In addition, the microreactor includes collection sections of the reaction solution at the junction between the tube reactor 5 and the micromixer 6, and at the downstream end of the tube reactor 7, but the collection sections are omitted in the FIGURE.

A custom-made product available from Sanko Seiki K.K. was used as the micromixer (an equivalent micromixer can be obtained upon request for manufacture based on the description of the present examples). The mixer was made of stainless steel, T-shaped, and had an inner diameter of 400 µm. Stainless steel tubes available from GL Sciences Inc. were used as the tube reactors 5 and 7. A syringe pump Model 11 Plus available from Harvard Corporation was used as the pump for pumping liquid. The reaction temperature was controlled by immersing the entire microreactor in a constant temperature bath.

Examples 1 and 2

First Stage Reaction

Azobisisobutyronitrile (AIBN) as a polymerization initiator, and a mixture of equimolar amounts of γ-butyrolactone (meth)acrylate (GBLMA) and 1-methylcyclopentyl (meth)acrylate (MCPMA) as a first monomer component were fed into the microreactor via the inlet path for polymerization initiator and others, and the first monomer inlet path, respectively. Thereafter, the reaction solution was collected, and amounts of the remaining monomers, weight average molecular weight of the reaction product (polymer), and the like were measured. Conversion ratios of the monomers in the first stage reaction, the weight average molecular weight and molecular weight distribution of the polymer, and conditions, such as the flow rate of the microreactor, were as listed in Table 1.

Second Stage Reaction

After the first stage reaction, a mixture of equimolar amounts of GBLMA and MCPMA was further fed as a second monomer component into the microreactor via the second monomer inlet path. Thereafter, the reaction solution was collected, and amounts of the remaining monomers, weight average molecular weight of the reaction product (polymer), and the like were measured. Conversion ratios of the monomers in the second stage reaction, the weight average molecular weight and molecular weight distribution of the polymer, and conditions, such as the flow rate of the microreactor, were as listed in Table 2.

Example 3

First Stage Reaction

A mixture of azobisisobutyronitrile (AIBN) as a polymerization initiator and 2-cyano-2-propyl 4-cyanobenzodithioate (RAFT-A) as a chain transfer agent, and a mixture of equimolar amounts of γ-butyrolactone (meth)acrylate (GBLMA) and 1-methylcyclopentyl (meth)acrylate (MCPMA) as a first monomer component were fed into the microreactor via the inlet path for polymerization initiator and others, and the first monomer inlet path, respectively. Thereafter, the reaction solution was collected, and amounts of the remaining monomers, weight average molecular weight of the reaction product (polymer), and the like were measured. Conversion ratios of the monomers in the first stage reaction, the weight average molecular weight and molecular weight distribution of the polymer, and conditions, such as the flow rate of the microreactor, were as listed in Table 1.

Second Stage Reaction

After the first stage reaction, a mixture of equimolar amounts of GBLMA and MCPMA was further fed as a second monomer component into the microreactor via the second monomer inlet path. Thereafter, the reaction solution was collected, and amounts of the remaining monomers, weight average molecular weight of the reaction product (polymer), and the like were measured. Conversion ratios of the monomers in the second stage reaction, the weight average molecular weight and molecular weight distribution of the polymer, and conditions, such as the flow rate of the microreactor, were as listed in Table 2.

Examples 4 to 24

Examples 4 to 24 were performed in the same manner as in Example 3 with the exception that the polymerization initiator, the chain transfer agent, and the reaction conditions were changed to those listed in Tables 1 and 2. Weight average molecular weight s and the like of the polymers obtained in the first and second stage reactions were measured and listed in Tables 1 and 2, respectively.

TABLE 1

| | | | | First stage reaction | | | | |
| --- | --- | --- | --- | --- | --- | --- | --- | --- |
| Examples | First monomer component | Polymerization initiator | Chain transfer agent | Flow rate (mL/min) | Monomer concentration (mol/L) | Concentrations of polymerization initiator and chain transfer agent (mol/L) | Polymerization initiator and chain transfer agent/ monomers (mol %) | Temperature (° C.) |
| Example 1 | GBLMA/MCPMA | AIBN | — | 0.06 | 0.81 | 0.06 | 8.0 | 80 |
| Example 2 | GBLMA/MCPMA | AIBN | — | 0.06 | 0.81 | 0.06 | 7.2 | 80 |
| Example 3 | GBLMA/MCPMA | AIBN | RAFT-A | 0.06 | 0.81 | 0.06 | 8.0 | 80 |
| Example 4 | GBLMA/MCPMA | AIBN | RAFT-A | 0.06 | 0.81 | 0.03 | 4.0 | 80 |
| Example 5 | GBLMA/MCPMA | AIBN | RAFT-A | 0.06 | 0.81 | 0.03 | 4.0 | 90 |
| Example 6 | GBLMA/MCPMA | AIBN | RAFT-A | 0.03 | 0.81 | 0.06 | 7.4 | 80 |
| Example 7 | GBLMA/MCPMA | AIBN | RAFT-A | 0.06 | 0.81 | 0.06 | 7.1 | 80 |
| Example 8 | GBLMA/MCPMA | AIBN | RAFT-A | 0.06 | 0.81 | 0.01 | 0.7 | 80 |
| Example 9 | GBLMA/MCPMA | AIBN | RAFT-A | 0.06 | 0.81 | 0.01 | 1.8 | 80 |
| Example 10 | GBLMA/MCPMA | AIBN | RAFT-A | 0.06 | 0.81 | 0.01 | 0.9 | 80 |
| Example 11 | GBLMA/MCPMA | AIBN | RAFT-A | 0.06 | 0.81 | 0.01 | 1.8 | 80 |
| Example 12 | GBLMA/MCPMA | AIBN | RAFT-A | 0.06 | 0.81 | 0.01 | 1.8 | 90 |
| Example 13 | GBLMA/MCPMA | AIBN | RAFT-A | 0.06 | 0.81 | 0.01 | 1.8 | 80 |
| Example 14 | GBLMA/MCPMA | AIBN | RAFT-A | 0.06 | 0.81 | 0.01 | 1.8 | 90 |
| Example 15 | GBLMA/MCPMA | AIBN | RAFT-A | 0.06 | 0.81 | 0.01 | 1.8 | 100 |
| Example 16 | GBLMA/MCPMA | AIBN | RAFT-A | 0.06 | 0.81 | 0.01 | 1.8 | 110 |
| Example 17 | GBLMA/MCPMA | AIBN | RAFT-A | 0.06 | 0.81 | 0.01 | 1.8 | 120 |

TABLE 1-continued

| Examples | | | | | | | | |
|---|---|---|---|---|---|---|---|---|
| Example 18 | GBLMA/MCPMA | AIBN | RAFT-B | 0.06 | 0.81 | 0.01 | 1.8 | 80 |
| Example 19 | GBLMA/MCPMA | V-601 | RAFT-A | 0.06 | 0.81 | 0.01 | 1.8 | 80 |
| Example 20 | GBLMA/MCPMA | V-601 | RAFT-B | 0.06 | 0.81 | 0.01 | 1.8 | 80 |
| Example 21 | GBLMA/MCPMA | V-601 | RAFT-B | 0.06 | 0.81 | 0.03 | 3.6 | 80 |
| Example 22 | GBLMA/MCPMA | V-601 | RAFT-B | 0.06 | 0.81 | 0.03 | 3.6 | 80 |
| Example 23 | GBLMA/MCPMA | V-601 | RAFT-B | 0.06 | 0.81 | 0.03 | 3.6 | 80 |
| Example 24 | GBLMA/MCPMA | V-601 | RAFT-B | 0.06 | 0.81 | 0.03 | 3.6 | 80 |

| | First stage reaction | | | | | | | | | |
|---|---|---|---|---|---|---|---|---|---|---|
| Examples | Flow path length (m) | Flow path inner diameter (mm) | Flow path volume (mL) | Residence time (min) | GBLMA conversion ratio (%) | MCPMA conversion ratio (%) | Average conversion ratio (%) | GBLMA proportion in system (%) | MCPMA proportion in system (%) | Weight average molecular weight of polymer (Mw) | Molecular weight distribution of polymer (Mw/Mn) |
| Example 1 | 4.5 | 0.5 | 0.88 | 14.7 | 60.8 | 35.1 | 48.0 | 63.4 | 36.6 | 13,860 | 1.77 |
| Example 2 | 1.2 | 1.0 | 0.94 | 15.7 | 65.7 | 31.6 | 48.7 | 67.5 | 32.5 | 11,437 | 1.75 |
| Example 3 | 4.5 | 0.5 | 0.88 | 14.7 | 25.1 | 17.7 | 21.4 | 58.6 | 41.4 | 757 | 1.25 |
| Example 4 | 4.5 | 0.5 | 0.88 | 14.7 | 23.7 | 9.5 | 16.6 | 71.4 | 28.6 | 1,009 | 1.10 |
| Example 5 | 4.5 | 0.5 | 0.88 | 14.7 | 47.6 | 31.9 | 39.8 | 59.8 | 40.2 | 956 | 1.32 |
| Example 6 | 4.5 | 0.5 | 0.88 | 29.4 | 74.5 | 38.3 | 56.4 | 66.1 | 33.9 | 909 | 1.10 |
| Example 7 | 1.2 | 1.0 | 0.94 | 15.7 | 52.1 | 19.6 | 35.9 | 72.7 | 27.3 | 747 | 1.09 |
| Example 8 | 1.2 | 1.0 | 0.94 | 15.7 | 36.1 | 0.9 | 18.5 | 97.6 | 2.4 | 1,539 | 1.17 |
| Example 9 | 2.3 | 1.0 | 1.81 | 30.1 | 26.9 | 19.5 | 23.2 | 58.0 | 42.0 | 1,348 | 1.20 |
| Example 10 | 2.3 | 1.0 | 1.81 | 30.1 | 16.3 | 16.2 | 16.3 | 50.2 | 49.8 | 1,337 | 1.15 |
| Example 11 | 4.6 | 1.0 | 3.61 | 60.2 | 52.9 | 39.2 | 46.1 | 57.4 | 42.6 | 1,870 | 1.18 |
| Example 12 | 4.6 | 1.0 | 3.61 | 60.2 | 81.4 | 68.1 | 74.7 | 54.5 | 45.5 | 2,149 | 1.19 |
| Example 13 | 1.2 | 1.0 | 0.94 | 15.7 | 9.8 | 3.9 | 6.9 | 71.5 | 28.5 | 1,106 | 1.12 |
| Example 14 | 1.2 | 1.0 | 0.94 | 15.7 | 27.0 | 20.5 | 23.8 | 56.8 | 43.2 | 1,956 | 1.17 |
| Example 15 | 1.2 | 1.0 | 0.94 | 15.7 | 41.6 | 32.1 | 36.9 | 56.4 | 43.6 | 2,113 | 1.18 |
| Example 16 | 1.2 | 1.0 | 0.94 | 15.7 | 43.2 | 33.0 | 38.1 | 56.7 | 43.3 | 1,965 | 1.19 |
| Example 17 | 1.2 | 1.0 | 0.94 | 15.7 | 27.5 | 18.8 | 23.1 | 59.4 | 40.6 | 1,534 | 1.17 |
| Example 18 | 4.6 | 1.0 | 3.61 | 60.2 | 70.8 | 55.5 | 63.2 | 56.1 | 43.9 | 5,134 | 1.45 |
| Example 19 | 4.6 | 1.0 | 3.61 | 60.2 | 49.5 | 42.0 | 45.8 | 54.1 | 45.9 | 1,836 | 1.17 |
| Example 20 | 4.6 | 1.0 | 3.61 | 60.2 | 65.6 | 50.9 | 58.2 | 56.3 | 43.7 | 3,815 | 1.34 |
| Example 21 | 4.6 | 1.0 | 3.61 | 60.2 | 76.7 | 63.9 | 70.3 | 54.6 | 45.4 | 2,953 | 1.28 |
| Example 22 | 4.6 | 1.0 | 3.61 | 60.2 | 76.6 | 62.7 | 69.7 | 55.0 | 45.0 | 2,811 | 1.28 |
| Example 23 | 4.6 | 1.0 | 3.61 | 60.2 | 72.2 | 60.6 | 66.4 | 54.4 | 45.6 | 2,974 | 1.29 |
| Example 24 | 4.6 | 1.0 | 3.61 | 60.2 | 75.9 | 78.4 | 77.2 | 49.2 | 50.8 | 2,804 | 1.29 |

TABLE 2

| | Second stage reaction | | | | | | |
|---|---|---|---|---|---|---|---|
| Examples | Second monomer component | Flow rate during feeding (mL/min) | Flow rate (mL/min) | Monomer concentration (mol/L) | Concentrations of polymerization initiator and chain transfer agent (mol/L) | Polymerization initiator and chain transfer agent/monomers (mol %) | Temperature (° C.) | Flow path length (m) |
| Example 1 | GBLMA/MCPMA | 0.04 | 0.10 | 0.72 | 0.034 | 4.7 | 80 | 7.7 |
| Example 2 | GBLMA/MCPMA | 0.04 | 0.10 | 0.72 | 0.031 | 4.3 | 80 | 2.0 |
| Example 3 | GBLMA/MCPMA | 0.04 | 0.10 | 0.85 | 0.034 | 4.0 | 80 | 7.7 |
| Example 4 | GBLMA/MCPMA | 0.04 | 0.10 | 0.87 | 0.017 | 1.9 | 80 | 7.7 |
| Example 5 | GBLMA/MCPMA | 0.04 | 0.10 | 0.76 | 0.017 | 2.2 | 90 | 7.7 |
| Example 6 | GBLMA/MCPMA | 0.02 | 0.05 | 0.68 | 0.031 | 4.6 | 80 | 7.7 |
| Example 7 | GBLMA/MCPMA | 0.04 | 0.10 | 0.78 | 0.030 | 3.8 | 80 | 2.0 |
| Example 8 | GBLMA/MCPMA | 0.04 | 0.10 | 0.87 | 0.003 | 0.3 | 80 | 2.0 |
| Example 9 | GBLMA/MCPMA | 0.04 | 0.10 | 0.84 | 0.008 | 0.9 | 80 | 4.0 |
| Example 10 | GBLMA/MCPMA | 0.04 | 0.10 | 0.88 | 0.004 | 0.4 | 80 | 4.0 |
| Example 11 | GBLMA/MCPMA | 0.04 | 0.10 | 0.73 | 0.008 | 1.0 | 80 | 8.0 |
| Example 12 | GBLMA/MCPMA | 0.04 | 0.10 | 0.60 | 0.008 | 1.3 | 90 | 8.0 |
| Example 13 | GBLMA/MCPMA | 0.04 | 0.10 | 0.92 | 0.008 | 0.8 | 80 | 2.0 |
| Example 14 | GBLMA/MCPMA | 0.04 | 0.10 | 0.84 | 0.008 | 0.9 | 90 | 2.0 |
| Example 15 | GBLMA/MCPMA | 0.04 | 0.10 | 0.78 | 0.008 | 1.0 | 100 | 2.0 |
| Example 16 | GBLMA/MCPMA | 0.04 | 0.10 | 0.77 | 0.008 | 1.0 | 110 | 2.0 |
| Example 17 | GBLMA/MCPMA | 0.04 | 0.10 | 0.84 | 0.008 | 0.9 | 120 | 2.0 |
| Example 18 | GBLMA/MCPMA | 0.04 | 0.10 | 0.65 | 0.008 | 1.2 | 80 | 8.0 |
| Example 19 | GBLMA/MCPMA | 0.04 | 0.10 | 0.74 | 0.008 | 1.0 | 80 | 8.0 |
| Example 20 | GBLMA/MCPMA | 0.04 | 0.10 | 0.68 | 0.008 | 1.1 | 80 | 8.0 |
| Example 21 | GBLMA/MCPMA | 0.04 | 0.10 | 0.62 | 0.015 | 2.5 | 80 | 8.0 |
| Example 22 | GBLMA/MCPMA | 0.04 | 0.10 | 0.62 | 0.015 | 2.5 | 80 | 8.0 |
| Example 23 | GBLMA/MCPMA | 0.04 | 0.10 | 0.64 | 0.015 | 2.4 | 80 | 8.0 |
| Example 24 | GBLMA/MCPMA | 0.04 | 0.10 | 0.59 | 0.015 | 2.6 | 80 | 8.0 |

TABLE 2-continued

| | | | | Second stage reaction | | | | | | |
|---|---|---|---|---|---|---|---|---|---|---|
| Examples | Flow path inner diameter (mm) | Flow path volume (mL) | Residence time (min) | GBLMA conversion ratio (%) | MCPMA conversion ratio (%) | Average conversion ratio (%) | GBLMA proportion in system (%) | MCPMA proportion in system (%) | Polymer weight average molecular weight (Mw) | Polymer molecular weight distribution (Mw/Mn) |
| Example 1 | 0.5 | 1.51 | 14.9 | 67.7 | 47.0 | 57.4 | 59.0 | 41.0 | 16,043 | 1.82 |
| Example 2 | 1.0 | 1.57 | 15.4 | 78.0 | 43.6 | 60.8 | 64.1 | 35.9 | 14,741 | 1.91 |
| Example 3 | 0.5 | 1.51 | 14.9 | 36.1 | 26.2 | 31.2 | 57.9 | 42.1 | 1,184 | 1.27 |
| Example 4 | 0.5 | 1.51 | 14.9 | 35.2 | 20.1 | 27.7 | 63.7 | 36.3 | 1,437 | 1.14 |
| Example 5 | 0.5 | 1.51 | 14.9 | 56.9 | 41.2 | 49.1 | 58.0 | 42.0 | 1,487 | 1.16 |
| Example 6 | 0.5 | 1.51 | 29.6 | 85.2 | 47.8 | 66.5 | 64.1 | 35.9 | 1,195 | 1.18 |
| Example 7 | 1.0 | 1.57 | 15.4 | 58.8 | 29.7 | 44.3 | 66.4 | 33.6 | 1,069 | 1.16 |
| Example 8 | 1.0 | 1.57 | 15.4 | 42.4 | 12.0 | 27.2 | 77.9 | 22.1 | 2,368 | 1.22 |
| Example 9 | 1.0 | 3.14 | 30.8 | 38.4 | 28.3 | 33.4 | 57.6 | 42.4 | 1,986 | 1.22 |
| Example 10 | 1.0 | 3.14 | 30.8 | 22.0 | 19.7 | 20.9 | 52.8 | 47.2 | 1,915 | 1.18 |
| Example 11 | 1.0 | 6.28 | 61.6 | 63.3 | 49.1 | 56.2 | 56.3 | 43.7 | 2,824 | 1.20 |
| Example 12 | 1.0 | 6.28 | 61.6 | 69.9 | 57.3 | 63.6 | 54.9 | 45.1 | 2,436 | 1.20 |
| Example 13 | 1.0 | 1.57 | 15.4 | 29.9 | 22.0 | 26.0 | 57.6 | 42.4 | 1,707 | 1.17 |
| Example 14 | 1.0 | 1.57 | 15.4 | 44.0 | 33.6 | 38.8 | 56.7 | 43.3 | 3,191 | 1.19 |
| Example 15 | 1.0 | 1.57 | 15.4 | 48.7 | 37.1 | 42.9 | 56.8 | 43.2 | 3,155 | 1.18 |
| Example 16 | 1.0 | 1.57 | 15.4 | 26.5 | 18.2 | 22.3 | 59.2 | 40.8 | 2,179 | 1.20 |
| Example 17 | 1.0 | 1.57 | 15.4 | 15.9 | 10.5 | 13.2 | 60.3 | 39.7 | 1,546 | 1.16 |
| Example 18 | 1.0 | 6.28 | 61.6 | 71.1 | 58.1 | 64.6 | 55.0 | 45.0 | 6,240 | 1.45 |
| Example 19 | 1.0 | 6.28 | 61.6 | 54.9 | 46.9 | 50.9 | 53.9 | 46.1 | 2,672 | 1.19 |
| Example 20 | 1.0 | 6.28 | 61.6 | 66.8 | 53.2 | 60.0 | 55.7 | 44.3 | 4,953 | 1.31 |
| Example 21 | 1.0 | 6.28 | 61.6 | 77.4 | 65.7 | 71.6 | 54.1 | 45.9 | 3,673 | 1.31 |
| Example 22 | 1.0 | 6.28 | 61.6 | 85.3 | 73.5 | 79.4 | 53.7 | 46.3 | 3,700 | 1.32 |
| Example 23 | 1.0 | 6.28 | 61.6 | 85.4 | 76.6 | 81.0 | 52.7 | 47.3 | 4,006 | 1.34 |
| Example 24 | 1.0 | 6.28 | 61.6 | 89.6 | 93.7 | 91.6 | 48.9 | 51.1 | 3,851 | 1.35 |

REFERENCE SIGNS LIST

1 Inlet path for polymerization initiator and others
2 First monomer inlet path
3 Micromixer
4 Second monomer inlet path
5 Tube reactor
6 Micromixer
7 Tube reactor

The invention claimed is:

1. A method for manufacturing a polymer using a microreactor comprising a flow path capable of mixing a plurality of liquids to perform radical polymerization of a monomer component containing two or more different monomers in the presence of a polymerization initiator;
wherein the microreactor comprises a first inlet port configured to feed the monomer component and an additional inlet port located downstream of the first inlet port; and
the method comprises feeding the monomer component through the first inlet port and the additional inlet port, wherein an inner diameter of the flow path is from 200 μm to 1 mm.

2. The method for manufacturing a polymer according to claim 1, wherein the monomer component to be fed through the first inlet port and the additional inlet port contains two or more different (meth)acrylic-based monomers.

3. The method for manufacturing a polymer according to claim 1, wherein the monomers contained in the monomer component to be fed through the first inlet port and the additional inlet port are the same, and a difference between the contents of each monomer is within ±5%.

4. The method for manufacturing a polymer according to claim 2, wherein the monomers contained in the monomer component to be fed through the first inlet port and the additional inlet port are the same, and a difference between the contents of each monomer is within ±5%.

5. The method for manufacturing a polymer according to claim 1, wherein the radical polymerization is performed in the presence of the polymerization initiator and a chain transfer agent.

6. The method for manufacturing a polymer according to claim 2, wherein the radical polymerization is performed in the presence of the polymerization initiator and a chain transfer agent.

7. The method for manufacturing a polymer according to claim 3, wherein the radical polymerization is performed in the presence of the polymerization initiator and a chain transfer agent.

8. The method for manufacturing a polymer according to claim 4, wherein the radical polymerization is performed in the presence of the polymerization initiator and a chain transfer agent.

9. The method for manufacturing a polymer according to claim 5, wherein the chain transfer agent contains no cyano group and contains a thiocarbonylthio group; and the polymerization initiator contains no cyano group.

10. The method for manufacturing a polymer according to claim 6, wherein the chain transfer agent contains no cyano group and contains a thiocarbonylthio group; and the polymerization initiator contains no cyano group.

11. The method for manufacturing a polymer according to claim 7, wherein the chain transfer agent contains no cyano group and contains a thiocarbonylthio group; and the polymerization initiator contains no cyano group.

12. The method for manufacturing a polymer according to claim 8, wherein the chain transfer agent contains no cyano group and contains a thiocarbonylthio group; and the polymerization initiator contains no cyano group.

13. The method for manufacturing a polymer according to claim 5, wherein the chain transfer agent contains a cyano group and a thiocarbonylthio group.

14. The method for manufacturing a polymer according to claim 6, wherein the chain transfer agent contains a cyano group and a thiocarbonylthio group.

15. The method for manufacturing a polymer according to claim 7, wherein the chain transfer agent contains a cyano group and a thiocarbonylthio group.

16. The method for manufacturing a polymer according to claim 8, wherein the chain transfer agent contains a cyano group and a thiocarbonylthio group.

17. The method for manufacturing a polymer according to claim 1, wherein a molecular weight distribution (Mw/Mn) of the polymer is 1.45 or less.

18. The method for manufacturing a polymer according to claim 4, wherein a molecular weight distribution (Mw/Mn) of the polymer is 1.45 or less.

19. The method for manufacturing a polymer according to claim 12, wherein a molecular weight distribution (Mw/Mn) of the polymer is 1.45 or less.

20. The method for manufacturing a polymer according to claim 16, wherein a molecular weight distribution (Mw/Mn) of the polymer is 1.45 or less.

* * * * *